United States Patent
Mimura

(10) Patent No.: US 7,876,020 B2
(45) Date of Patent: Jan. 25, 2011

(54) BOUNDARY ACOUSTIC WAVE DEVICE INCLUDING IDT ELECTRODES INCLUDING A PLURALITY OF CONDUCTIVE LAYERS WITH DIFFERENT DENSITIES

(75) Inventor: Masakazu Mimura, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/545,229

(22) Filed: Aug. 21, 2009

(65) Prior Publication Data

US 2009/0302709 A1 Dec. 10, 2009

Related U.S. Application Data

(63) Continuation of application No. PCT/JP2008/053259, filed on Feb. 26, 2008.

(30) Foreign Application Priority Data

Mar. 6, 2007 (JP) ............................. 2007-055313

(51) Int. Cl.
*H01L 41/04* (2006.01)
(52) U.S. Cl. ............................. 310/313 B; 310/313 R
(58) Field of Classification Search ............. 310/313 R, 310/313 B
See application file for complete search history.

(56) References Cited

U.S. PATENT DOCUMENTS

| | | | |
|---|---|---|---|
| 5,844,347 A * | 12/1998 | Takayama et al. | 310/313 R |
| 6,424,075 B1 * | 7/2002 | Inoue et al. | 310/313 R |
| 7,026,743 B2 * | 4/2006 | Fujimoto et al. | 310/313 A |
| 7,218,039 B2 * | 5/2007 | Hada et al. | 310/364 |
| 7,224,101 B2 | 5/2007 | Mishima et al. | |
| 7,327,071 B2 * | 2/2008 | Nishiyama et al. | 310/313 A |
| 7,411,334 B2 * | 8/2008 | Nishiyama et al. | 310/313 R |
| 7,411,473 B2 | 8/2008 | Kando | |

(Continued)

FOREIGN PATENT DOCUMENTS

JP 58-030217 A 2/1983

(Continued)

OTHER PUBLICATIONS

Official Communication issued in International Patent Application No. PCT/JP2008/053259, mailed on Apr. 15, 2008.

*Primary Examiner*—J. SanMartin
(74) *Attorney, Agent, or Firm*—Keating & Bennett, LLP

(57) ABSTRACT

A boundary acoustic wave device is capable of reducing insertion loss and the absolute value of the temperature coefficient of frequency (TCF). The boundary acoustic wave device utilizes a boundary acoustic wave propagating along the interface between a piezoelectric substance and a dielectric substance. The piezoelectric substance has a negative temperature coefficient of frequency and the dielectric substance has a positive temperature coefficient of frequency. IDT electrodes include a first conductive layer arranged on a side of the piezoelectric substance, a third conductive layer arranged on a side of the dielectric substance, and a second conductive layer arranged between the first and third conductive layers and composed of a metal having a lower density than those of the first and third conductive layers or an alloy primarily containing the metal. If thicknesses of the first, second, and third conductive layers are H1, H2, and H3, and a period of the IDT electrodes is $\lambda$, $0.04\lambda < H1+H3 < 0.12\lambda$, $H1 > 0.009\lambda$, $H3 > 0.022\lambda$, and $0.05\lambda < H2 < 0.16\lambda$ are satisfied.

9 Claims, 16 Drawing Sheets

U.S. PATENT DOCUMENTS

| | | |
|---|---|---|
| 7,456,544 B2 | 11/2008 | Kando |
| 7,554,428 B2 * | 6/2009 | Yamamoto et al. ........... 333/193 |
| 7,642,694 B2 * | 1/2010 | Kando .................... 310/313 R |
| 2002/0038985 A1 * | 4/2002 | Iwamoto ................. 310/313 R |
| 2006/0071579 A1 | 4/2006 | Kando |
| 2006/0103486 A1 * | 5/2006 | Ruile et al. ................. 333/133 |
| 2007/0120439 A1 * | 5/2007 | Kadota et al. ........... 310/313 R |
| 2008/0266024 A1 * | 10/2008 | Ruile et al. ................. 333/147 |
| 2009/0115287 A1 | 5/2009 | Kando |
| 2009/0174284 A1 * | 7/2009 | Mimura et al. .......... 310/313 A |
| 2010/0117483 A1 * | 5/2010 | Tanaka et al. ........... 310/313 B |

FOREIGN PATENT DOCUMENTS

| | | |
|---|---|---|
| JP | 41 32 309 A1 | 4/1993 |
| WO | 2006/114930 A1 | 11/2006 |
| WO | 2006/123585 A1 | 11/2006 |
| WO | 2006/126327 A1 | 11/2006 |

* cited by examiner

US 7,876,020 B2

BOUNDARY ACOUSTIC WAVE DEVICE INCLUDING IDT ELECTRODES INCLUDING A PLURALITY OF CONDUCTIVE LAYERS WITH DIFFERENT DENSITIES

BACKGROUND OF THE INVENTION

1. Field of the Invention

The present invention relates to a boundary acoustic wave device that utilizes a boundary acoustic wave propagating along the interface between a piezoelectric substance and a dielectric substance.

2. Description of the Related Art

To achieve simpler and smaller package structures, boundary acoustic wave devices have recently been attracting attention instead of surface acoustic devices. In boundary acoustic wave devices, boundary acoustic waves propagate along the interface between a first and second media. The first medium is composed of a piezoelectric substance because of the use of a piezoelectric effect. For example, the second medium is composed of a dielectric substance. Their characteristics have been improved by devising the piezoelectric substance, the dielectric substance, and materials constituting IDT electrodes arranged between the piezoelectric substance and the dielectric substance.

For example, in DE 4132309A1, IDT electrodes are composed of a metal, such as Au or Ag, having a large mass, instead of Al, which is often used as an electrode material in surface acoustic wave devices. The reflection of an undesired boundary wave seems to be suppressed by regulating the thickness of each IDT electrode composed of Au or Ag to a specific range.

In a boundary acoustic wave device having a stacked structure of dielectric substance/IDT/piezoelectric substance described in WO2006/126327, the IDT electrodes have a larger density than those of the dielectric substance and the piezoelectric substance, so that boundary acoustic waves propagate with the energy of boundary acoustic wave concentrated around the IDT electrodes. Each of the IDT electrodes has a stacked structure of two metals having different densities. A metal layer having a higher density is arranged on a piezoelectric substance side. The thickness of the metal layer having a higher density satisfies $0.025\lambda < H < 0.1\lambda$, where H represents the thickness of the metal layer, and $\lambda$ represents a wavelength determined by the period of the IDT electrodes. In WO2006/126327, the use of the electrodes results in a reduction in insertion loss.

WO2006/123585 also discloses a boundary acoustic wave device including IDT electrodes each having a stacked structure of two metals with different densities. Here, letting the density of a metal layer having a higher density be $\rho 1$, and letting the density of a metal layer having a lower density be $\rho 2$, $\rho 1/\rho 2 > 1.8$ is satisfied, and the metal layer having the density $\rho 1$ is arranged on a dielectric substance side. Furthermore, the thickness H of the metal layer having the density $\rho 1$ satisfies $0.034\lambda < H < 0.5\lambda$. This results in a reduction in the absolute value of the temperature coefficient of frequency (TCF), improving its temperature characteristics.

As described above, characteristics of boundary acoustic wave devices have been improved by devising thicknesses and types of metal materials constituting the IDT electrodes of the boundary acoustic wave devices and stacking structures of the IDT electrodes.

In each of WO2006/126327 and WO2006/123585, the metal layer having a relatively higher density and the metal layer having a relatively lower density are stacked to form each IDT electrode. Furthermore, in each of WO2006/126327 and WO2006/123585, the piezoelectric substance is composed of $LiNbO_3$ having a negative temperature coefficient of frequency (TCF), the dielectric substance is composed of $SiO_2$ having a positive temperature coefficient of frequency (TCF). In each of WO2006/126327 and WO2006/123585, improvement in insertion loss or a reduction in the absolute value of the temperature coefficient of frequency (TCF) is achieved by concentrating the energy of boundary acoustic wave around the IDT electrodes and biasing the energy on the metal layer side.

In WO2006/126327, although the insertion loss is reduced, the absolute value of the temperature coefficient of frequency (TCF) tends to increase. In contrast, in the boundary acoustic wave device described in WO2006/123585, although the absolute value of the temperature coefficient of frequency (TCF) is reduced, the electromechanical coefficient $K^2$ is reduced, disadvantageously the insertion loss is increased.

SUMMARY OF THE INVENTION

In order to overcome the foregoing problems in the related art, preferred embodiments of the present invention provide a boundary acoustic wave device including IDT electrodes arranged between a piezoelectric substance and a dielectric substance and which has a plurality of conductive layers with different densities, the device being capable of reducing the insertion loss and the absolute value of the temperature coefficient of frequency (TCF).

According to a preferred embodiment of the present invention, a boundary acoustic wave device includes a piezoelectric substance, a dielectric substance stacked on the piezoelectric substance, and IDT electrodes arranged between the piezoelectric substance and the dielectric substance, in which the piezoelectric substance has a negative temperature coefficient of frequency (TCF), the dielectric substance has a positive temperature coefficient of frequency (TCF), each of the IDT electrodes has a first conductive layer arranged on a side of the piezoelectric substance and composed of a metal with a relatively high density or an alloy primarily containing the metal, a second conductive layer arranged on a side of the first conductive layer adjacent to the dielectric substance and composed of a metal with a relatively low density or an alloy primarily containing the metal, and a third conductive layer arranged on a side of the second conductive layer adjacent to the dielectric substance and composed of a metal with a relatively high density or an alloy primarily containing the metal, and in which thicknesses of the first, second, and third conductive layers are H1, H2, and H3, and a period of the IDT electrodes is $\lambda$, the following relationships are satisfied: $0.04\lambda < H1+H3 < 0.12\lambda$, $H1 > 0.009\lambda$, $H3 > 0.022\lambda$, and $0.05\lambda < H2 < 0.16\lambda$.

The metal constituting the first and third conductive layers and having a relatively high density or the alloy primarily containing the metal is not particularly limited but is preferably one metal selected from Pt, Au, W, Ta, Cu, Ag, Ni, Fe, Cr, and Pd or an alloy primarily containing one metal among these metals. The material constituting the second conductive layer is not particularly limited but is preferably composed of one metal selected from Al, Mg, Ti, Cr, Ni, Cu, and Ag or an alloy primarily containing one metal among these metals, in which the metal or the alloy constituting the second conductive layer has a lower density than that of the metal or alloy having a high density.

In a specific aspect of the boundary acoustic wave device according to a preferred embodiment of the present invention, the first and third conductive layers are composed of Pt or an alloy primarily containing Pt, the second conductive layer is composed of Al or an alloy primarily containing Al, and the thicknesses H1 to H3 of the first to third conductive layers satisfy $0.04\lambda < H1+H3 < 0.12\lambda$, $H1 > 0.01\lambda$, $H3 > 0.022\lambda$, and $0.05\lambda < H2 < 0.15\lambda$. In this case, it is possible to achieve an electromechanical coefficient $K^2$ of about 10% or more, a sufficiently low insertion loss, and an absolute value of the temperature coefficient of frequency (TCF) of about 30 ppm/° C. or less, for example.

In another specific aspect of the boundary acoustic wave device according to a preferred embodiment of the present invention, the first and third conductive layers are composed of Au or an alloy primarily containing Au, the second conductive layer is composed of Al or an alloy primarily containing Al, and the thicknesses H1 to H3 of the first to third conductive layers satisfy $0.04\lambda < H1+H3 < 0.12\lambda$, $H1 > 0.009\lambda$, $H3 > 0.022\lambda$, and $0.05\lambda < H2 < 0.15\lambda$. In this case, it is possible to achieve an electromechanical coefficient $K^2$ of about 10% or more, a sufficiently low insertion loss, and an absolute value of the temperature coefficient of frequency (TCF) of about 30 ppm/° C. or less, for example.

In another specific aspect of the boundary acoustic wave device according to a preferred embodiment of the present invention, the first and third conductive layers are composed of Pt or an alloy primarily containing Pt, the second conductive layer is composed of Cu or an alloy primarily containing Cu, and the thicknesses H1 to H3 of the first to third conductive layers satisfy $0.06\lambda < H1+H3 < 0.14\lambda$, $H1 > 0.01\lambda$, $H3 > 0.03\lambda$, and $0.07\lambda < H2 < 0.16\lambda$. In this case, it is possible to achieve an electromechanical coefficient $K^2$ of about 10% or more, a sufficiently low insertion loss, and an absolute value of the temperature coefficient of frequency (TCF) of about 30 ppm/° C. or less, for example.

In another specific aspect of the boundary acoustic wave device according to a preferred embodiment of the present invention, the first and third conductive layers are composed of Au or an alloy primarily containing Au, the second conductive layer is composed of Cu or an alloy primarily containing Cu, and the thicknesses H1 to H3 of the first to third conductive layers satisfy $0.04\lambda < H1+H3 < 0.12\lambda$, $H1 > 0.01\lambda$, $H3 > 0.026\lambda$, and $0.05\lambda < H2 < 0.14\lambda$. In this case, it is possible to achieve an electromechanical coefficient $K^2$ of about 10% or more, a sufficiently low insertion loss, and an absolute value of the temperature coefficient of frequency (TCF) of about 30 ppm/° C. or less, for example.

In the boundary acoustic wave device according to various preferred embodiments of the present invention, preferably, each of the IDT electrodes further includes an adhesive layer that has a higher adhesion to a target material than the adhesion of each of the first to third conductive layers to the target material, and wherein the adhesive layer is arranged at least one selected from positions between the piezoelectric substance and the first conductive layer, between the dielectric substance and the third conductive layer, between the first and second conductive layers, and between the second and third conductive layers. The arrangement of the adhesive layer results in an effective and significant increase in the adhesion of the conductive layer in contact with the adhesion layer to the layer opposite the conductive layer with respect to the adhesion layer. Thus, the reliability and stability of the boundary acoustic wave device are increased.

Preferably, each of the IDT electrodes further includes a diffusion barrier layer that prevents the diffusion of the metals or the alloys constituting the electrodes, and the diffusion barrier layer is arranged at least one of positions between the piezoelectric substance and the first conductive layer, between the third conductive layer and the dielectric substance, between the first and second conductive layers, and between the second and third conductive layers. The arrangement of the diffusion barrier layer prevents undesired diffusion of the metals defining the conductive layers or alloys primarily containing the metals. Thereby, the characteristics of the boundary acoustic wave device are stabilized and the reliability the boundary acoustic wave device is enhanced.

In the boundary acoustic wave device according to various preferred embodiments of the present invention, each of the IDT electrodes includes the first to third conductive layers, in which thicknesses of the first to third conductive layers are H1 to H3, $0.04\lambda < H1+H3 < 0.14\lambda$, $H1 > 0.009\lambda$, $H3 > 0.022\lambda$, and $0.05\lambda < H2 < 0.16\lambda$ are satisfied. Thus, in a boundary acoustic wave device including a piezoelectric substance having a negative temperature coefficient of frequency (TCF) and a dielectric substance having a positive temperature coefficient of frequency (TCF), it is possible to achieve a sufficiently high electromechanical coefficient $K^2$, a low insertion loss, and a reduction in the absolute value of the temperature coefficient of frequency (TCF). A good balance between a reduction in insertion loss and a reduction in the temperature coefficient of frequency (TCF) is thus achieved. This makes it possible to provide a filter, a resonator, and the like having excellent electrical properties, e.g., only a small change in properties with temperature and a low insertion loss.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention will be explained by describing specific preferred embodiments according to the present invention with reference to the drawings.

First Preferred Embodiment

Figure 1A:
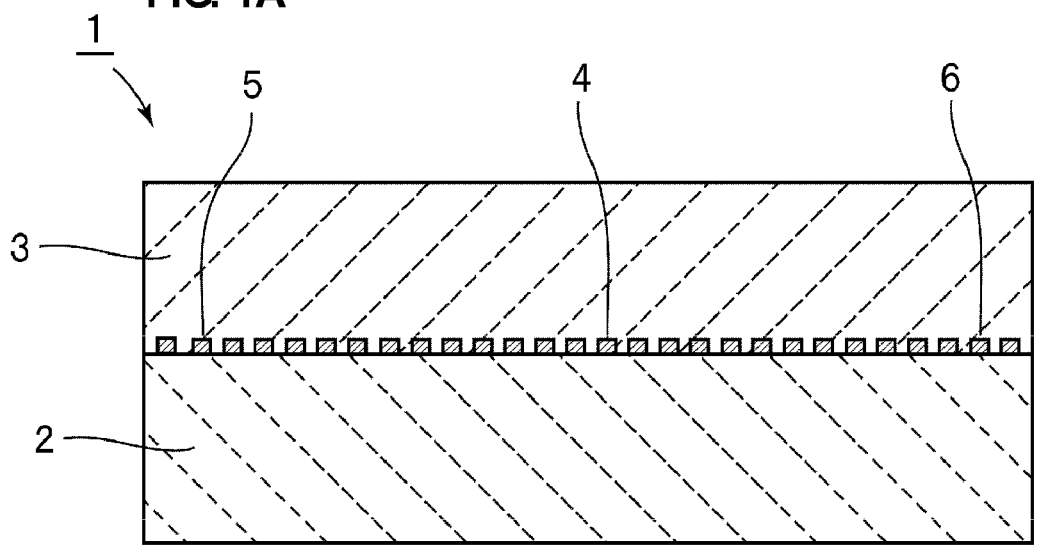
FIG. 1A is a schematic sectional elevational view of a boundary acoustic wave device according to a first preferred embodiment of the present invention.
Figure 1B:
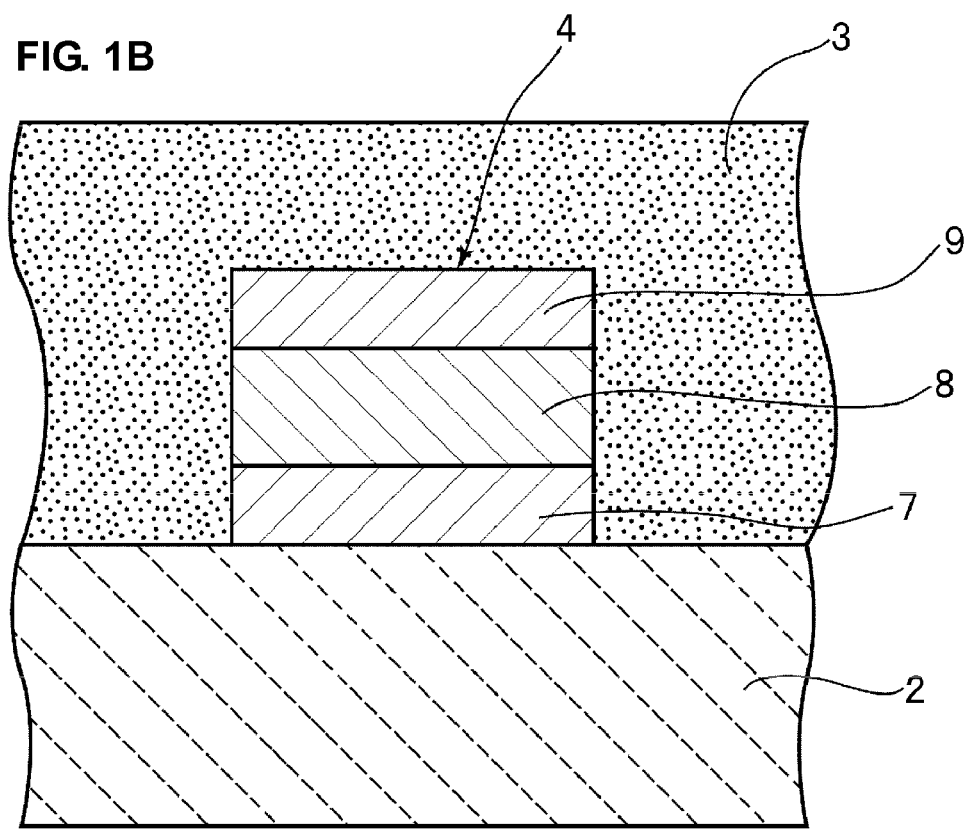
FIG. 1B is an enlarged partially sectioned elevational view illustrating the stacked structure of one IDT electrode of the boundary acoustic wave device.

FIG. 1A is a schematic sectional elevational view of a boundary acoustic wave device according to a first preferred embodiment of the present invention, and FIG. 1B is an enlarged partially sectioned elevational view of one IDT electrode of the boundary acoustic wave device.

A boundary acoustic wave device 1 includes a piezoelectric substance 2 and a dielectric substance 3 stacked on the piezoelectric substance 2. An electrode pattern including IDT electrodes 4 and reflectors 5 and 6 are arranged at the interface between the piezoelectric substance 2 and the dielectric substance 3.

In this preferred embodiment, the piezoelectric substance 2 preferably is composed of $LiNbO_3$. The dielectric substance 3 preferably is composed of $SiO_2$. The $LiNbO_3$ preferably has Euler angles (φ, θ, ψ) of (−5°<φ<5°, 100°<θ<110°, −30°<ψ<30°).

Figure 2:
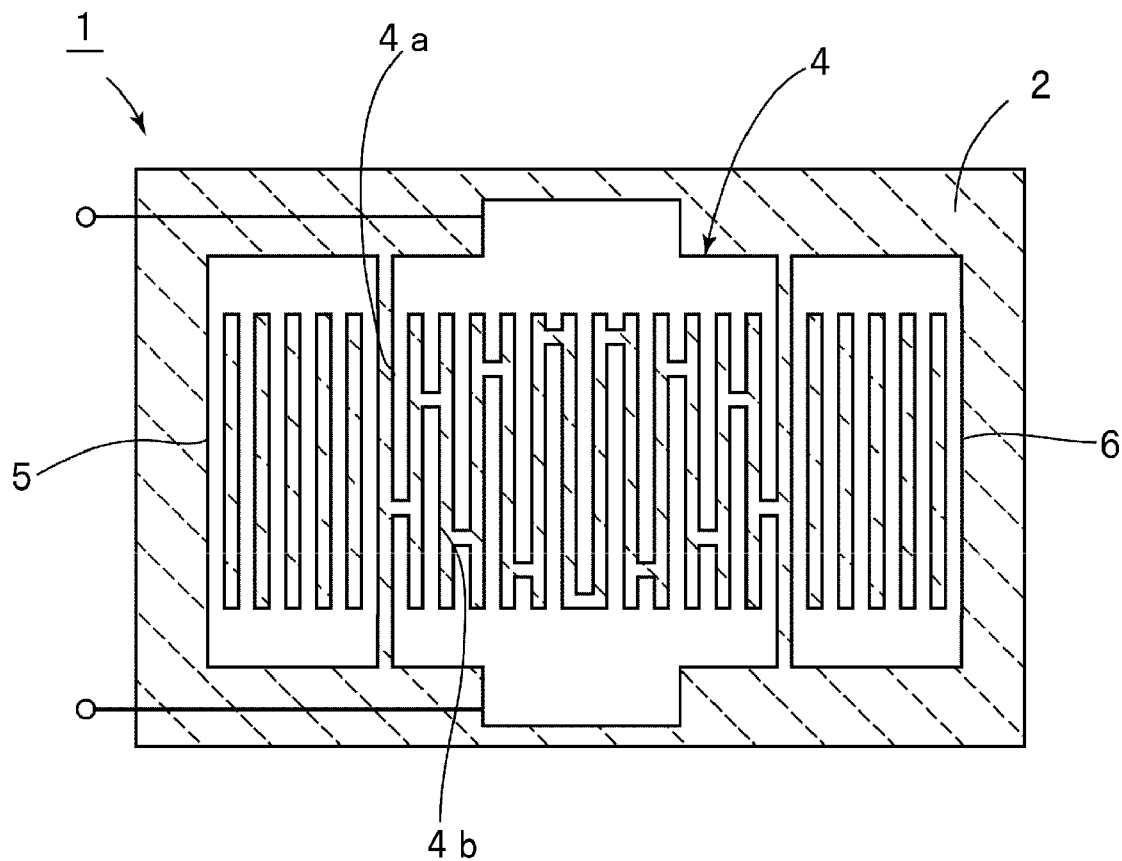
FIG. 2 is a schematic plan view illustrating the electrode structure of the boundary acoustic wave device according to the first preferred embodiment of the present invention.

As shown in FIG. 2, the IDT electrodes 4 have a structure in which a plurality of electrode fingers 4a and a plurality of electrode fingers 4b are arranged so as to interdigitate each other. The plurality of electrode fingers 4a are electrically connected to one bus bar. The plurality of electrode fingers 4b are electrically connected to the other bus bar. Each of the reflectors 5 and 6 has a planar shape in which both ends of a plurality of electrode fingers are short-circuited.

As shown in FIG. 1B, the IDT electrodes 4 and the reflectors 5 and 6 according to this preferred embodiment each have a structure in which a plurality of conductive layers, i.e., a first to third conductive layers, are stacked. As shown in FIG. 1B, each of the IDT electrodes 4 have a structure in which the first conductive layer 7, the second conductive layer 8, and the third conductive layer 9 are stacked in that order. The first conductive layer 7 is arranged on the side of the piezoelectric substance 2 and composed of a metal with a relatively high density or an alloy primarily containing the metal.

The second conductive layer 8 is arranged on the side of the first conductive layer 7 adjacent to the dielectric substance 3 and composed of a metal with a relatively low density or an alloy primarily containing the metal.

The third conductive layer 9 is arranged on the side of the second conductive layer 8 adjacent to the dielectric substance 3 and composed of a metal with a relatively high density or an alloy primarily containing the metal.

The metal with a relatively high density or the alloy primarily containing the metal, which constitutes the first and third conductive layers 7 and 9, is preferably, but not particularly limited to, one metal selected from Pt, Au, W, Ta, Cu, Ag, Ni, Fe, Cr, and Pd or an alloy primarily containing one of the metals. A material constituting the second conductive layer 8 is preferably composed of, but not limited to, one metal selected from Al, Mg, Ti, Cr, Ni, Cu, and Ag or an alloy primarily containing one of the metals, the metal or alloy having a lower density than that of the metal with a high density or the alloy described above. Table 1 shows densities of these metals.

TABLE 1

| | Density (kg/m$^3$) |
|---|---|
| Al | 2699 |
| Mg | 1740 |
| Ti | 4500 |
| Cr | 7190 |
| Fe | 7870 |
| Ni | 8845 |
| Cu | 8930 |
| Ag | 10490 |
| Pd | 12160 |
| Ta | 16678 |
| W | 19265 |
| Au | 19300 |
| Pt | 24100 |

One of the unique features of this preferred embodiment is that when thicknesses of the first, second, and third conductive layers 7, 8, 9 are defined as H1, H2, and H3 and the period of the IDT electrodes is defined as λ, 0.04λ<H1+H3<0.12λ, H1>0.009λ, H3>0.022λ, and 0.05λ<H2<0.16λ are satisfied. This results in a sufficiently high electromechanical coefficient $K^2$, which may reduce the insertion loss and the absolute value of the temperature coefficient of frequency (TCF). This will be more specifically described below.

The electromechanical coefficient $K^2$ and the temperature coefficient of frequency (TCF) of SH-type boundary acoustic wave in the boundary acoustic wave device 1 were determined by a simulation using the finite element method. Here, in the IDT electrodes 4, the first conductive layer 7 was composed of Pt, the second conductive layer 8 was composed of Al, and the third conductive layer 9 was composed of Pt. The thicknesses of the first to third conductive layers were H1 to H3 as described above. The piezoelectric substance 2 was a $LiNbO_3$ substrate with Euler angles (0°, 105°, 0°). The dielectric substance 3 was composed of $SiO_2$.

The electromechanical coefficient $K^2$ was determined from Equation (1) using an acoustic velocity Vf of boundary wave at an open boundary and an acoustic velocity Vm of boundary wave at a short-circuit boundary.

$$K^2 = 2 \times |Vf - Vm|/Vf \quad \text{Equation (1)}$$

The temperature coefficient of frequency (TCF) was determined from Equation (2) using sound velocities V[15° C.], V[25° C.], and V [35° C.] at 15° C., 25° C., and 35° C., of boundary waves, respectively.

$$TCF = ((V[35° C.] - [15° C.])/V[25° C.])/(35-15) - \alpha s \quad \text{Equation (2)}$$

where in equation (2), αs represents a coefficient of linear expansion of the piezoelectric substance in the propagation direction of boundary acoustic wave.

Figure 3:
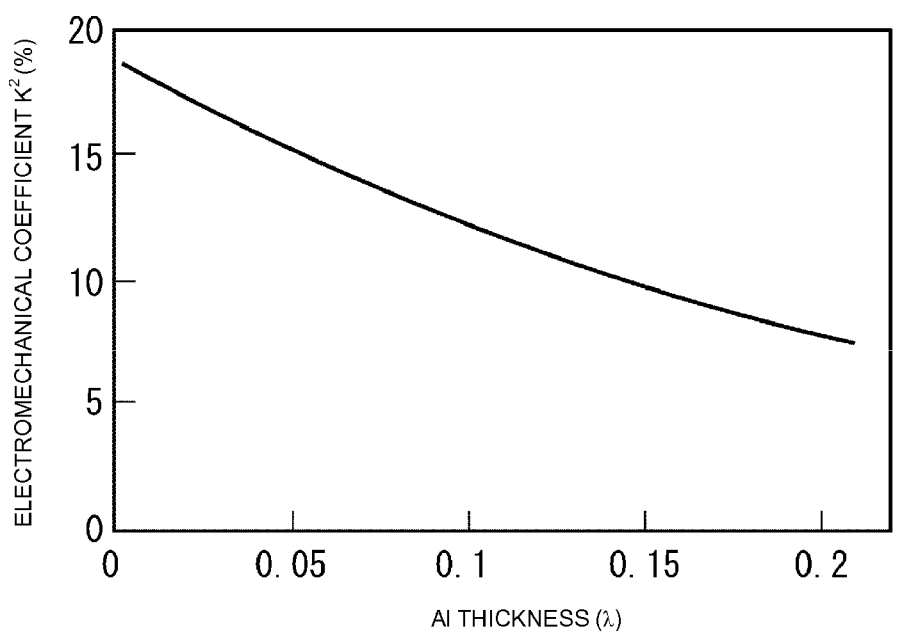
FIG. 3 shows a change in electromechanical coefficient $K^2$ (%) as an Al film constituting a second conductive layer is changed, provided that in the first preferred embodiment, thicknesses H1 and H3 of Pt films constituting first and third conductive layers are set to about $0.025\lambda$.
Figure 4:
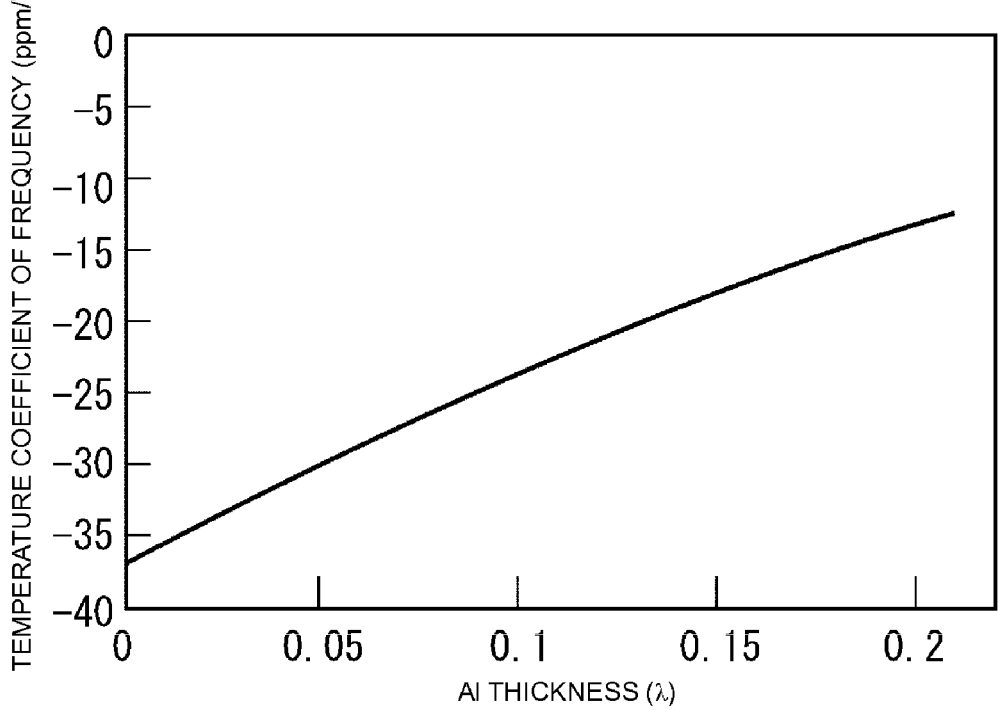
FIG. 4 shows a change in the temperature coefficient of frequency (TCF) (ppm/° C.) as the Al film constituting the second conductive layer is changed, provided that in the first preferred embodiment, the thicknesses H1 and H3 of the Pt films constituting the first and third conductive layers are set to about $0.025\lambda$.

FIG. 3 shows a change in the electromechanical coefficient $K^2$ as the thickness of an Al film constituting the second conductive layer 8 is changed, and FIG. 4 shows a change in temperature coefficient of frequency (TCF) as the thickness of an Al film constituting the second conductive layer 8, provided that each of the thickness H1 of the first conductive layer 7 and H3 of the third conductive layer 9 are set to about 0.025λ.

FIG. 4 clearly shows that the absolute value of the temperature coefficient of frequency (TCF) is reduced as the thickness H2 of the Al film constituting the second conductive layer 8 is increased. That is, in the case where the second conductive layer 8 is not present, i.e., the thickness of the Al film is zero, the temperature coefficient of frequency (TCF) is about −38 ppm/° C. The absolute value of the temperature coefficient of frequency (TCF) decreases as the thickness of the Al film increases.

FIG. 3 clearly shows that the electromechanical coefficient $K^2$ tends to decrease as the thickness of the Al film increase. The electromechanical coefficient $K^2$ required for a boundary acoustic wave device of this type is about 10% to about 15%, for example. Thus, the thickness H2 of the second conductive layer 8 is preferably in the range of about 0.05λ to about 0.15λ, for example. In this case, the temperature coefficient of frequency (TCF) is in the range of about −30 ppm/° C. to about −18 ppm/° C. from FIG. 4. The absolute value of the temperature coefficient of frequency (TCF) is relatively small, which is satisfactory.

Figure 5:
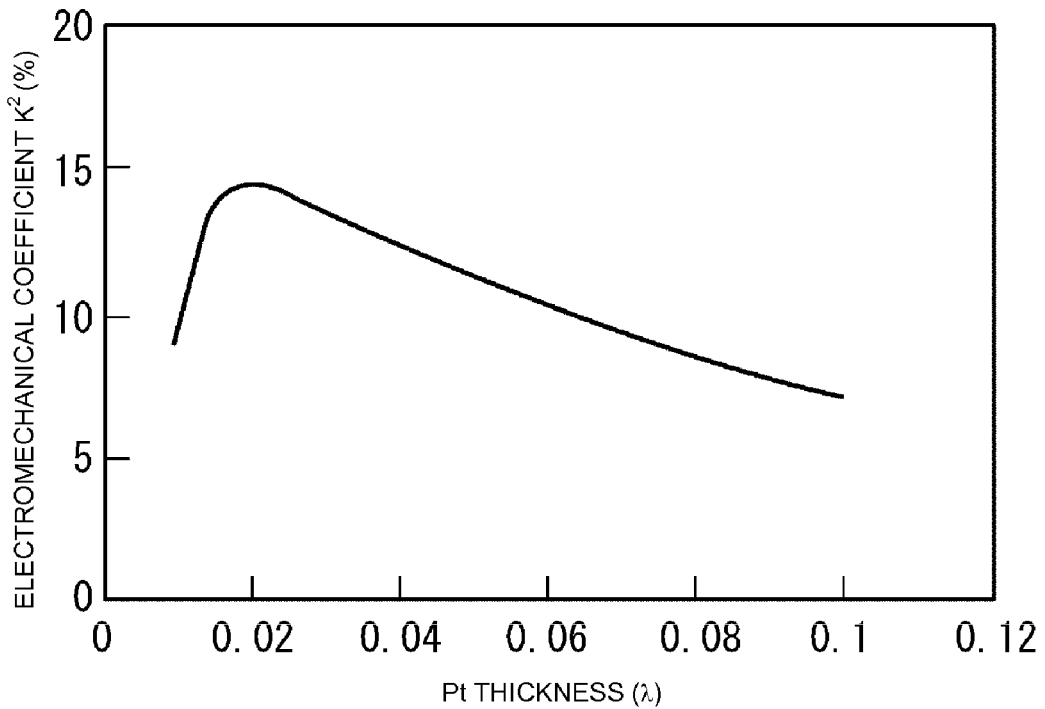
FIG. 5 shows a change in electromechanical coefficient $K^2$ (%) as the thicknesses H1 and H3 (H1=H3) of the Pt films constituting the first and third conductive layers are changed, provided that in the first preferred embodiment, the thickness H2 of the Al film constituting the second conductive layer is fixed to about $0.07\lambda$.
Figure 6:
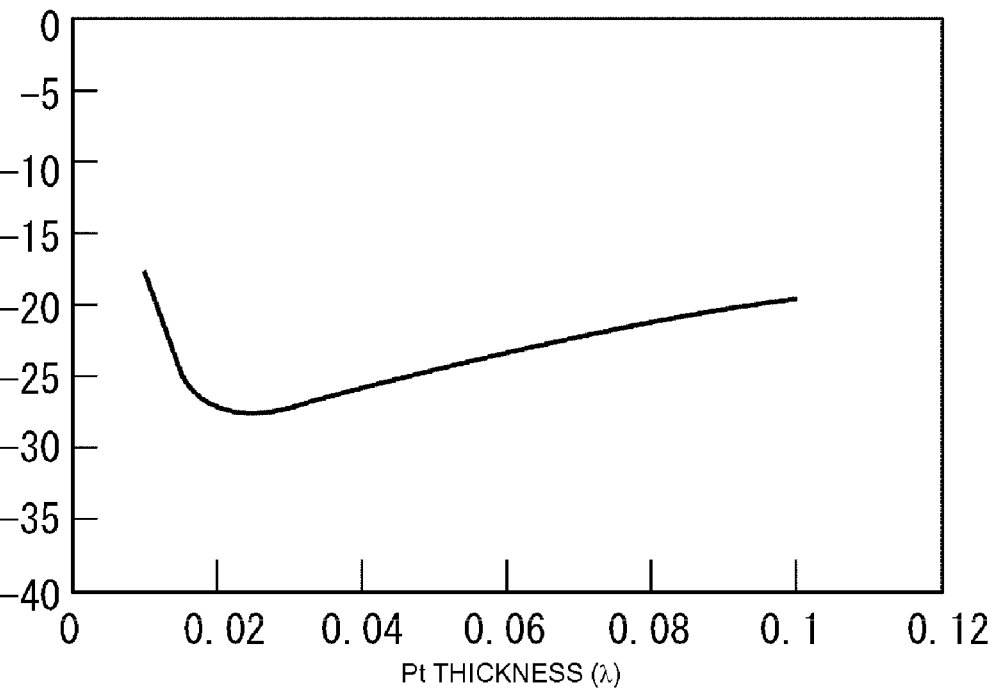
FIG. 6 shows a change in the temperature coefficient of frequency (TCF) (ppm/° C.) as the thicknesses H1 and H3 (H1=H3) of the Pt films constituting the first and third conductive layers are changed, provided that in the first preferred embodiment, the thickness H2 of the Al film constituting the second conductive layer is fixed to about $0.07\lambda$.

FIG. 5 shows a change in the electromechanical coefficient $K^2$ as the thickness of each of the first conductive layer 7 and the third conductive layer 9 are changed, and FIG. 6 shows a change in temperature coefficient of frequency (TCF) as the thickness of each of the first conductive layer 7 and the third conductive layer 9 are changed, provided that the thickness H2 of an Al film constituting the second conductive layer 8 is fixed to about 0.07λ and the thickness H1 of the first conductive layer 7 and the thickness H3 of the third conductive layer 9 satisfy H1=H3, the first conductive layer 7 and the third conductive layer 9 being composed of Pt.

FIGS. 5 and 6 clearly show that in the case where each of the thicknesses H1 and H2 of the first and third conductive layers is in the range of about 0.01λ to about 0.06λ, the electromechanical coefficient $K^2$ is within the range required, i.e., about 10% to about 15%, and the temperature coefficient of frequency (TCF) is in the range of about −20 ppm/° C. to about −28 ppm/° C., which is relatively satisfactory.

In the case where the thickness H1 of the first conductive layer 7 or the thickness H3 is about 0.02λ or less, however, boundary acoustic wave are not completely confined, so that the propagation loss is not zero. Thus, the thickness H1 is preferably more than about 0.02λ.

The results demonstrate that the sum of the thicknesses of the first and third conductive layers, i.e., H1+H3, therefore, preferably satisfy 0.04λ<H1+H3<0.12λ. In this case, the electromechanical coefficient $K^2$ is in the range of about 10% to about 15%, which is relatively high, and the temperature coefficient of frequency (TCF) is also relatively satisfactory.

Figure 7:
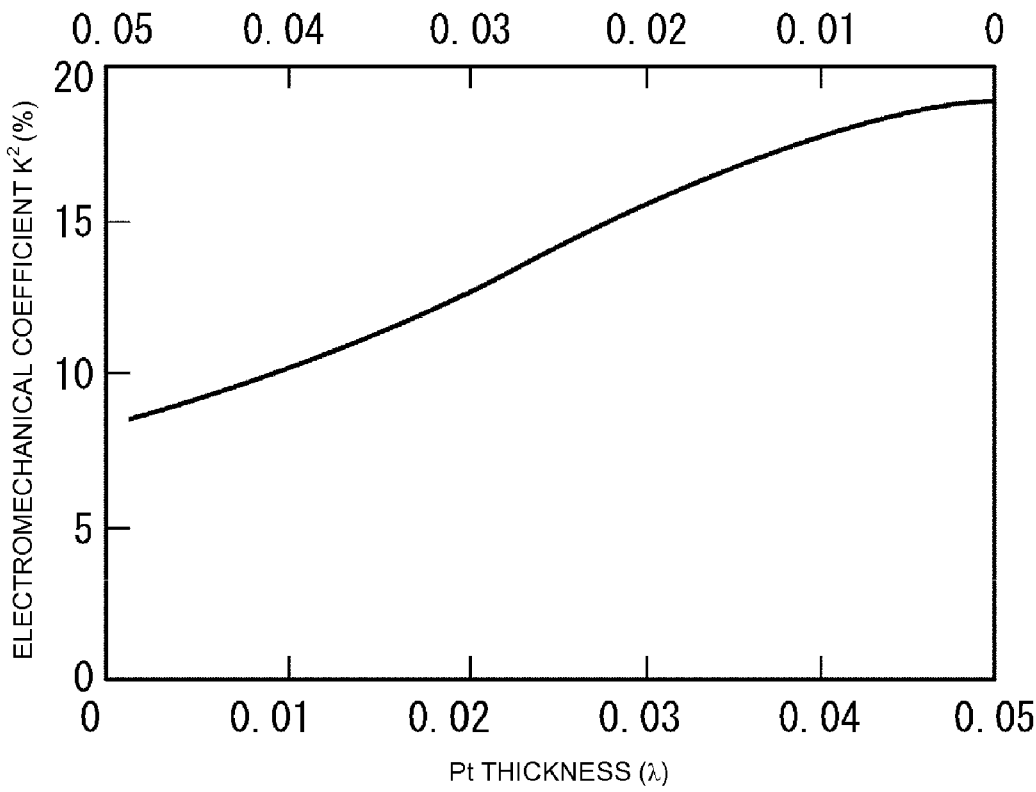
FIG. 7 shows a change in electromechanical coefficient $K^2$ (%) as the thicknesses H1 and H3 of the Pt films constituting the first and third conductive layers are changed, provided that in the first preferred embodiment, the thickness H2 of the Al film constituting the second conductive layer is fixed to about 0.07λ and that the sum of the thicknesses H1 and H3 of the Pt films constituting the first and third conductive layers, i.e., H1+H3, is fixed to about 0.05λ.
Figure 8:
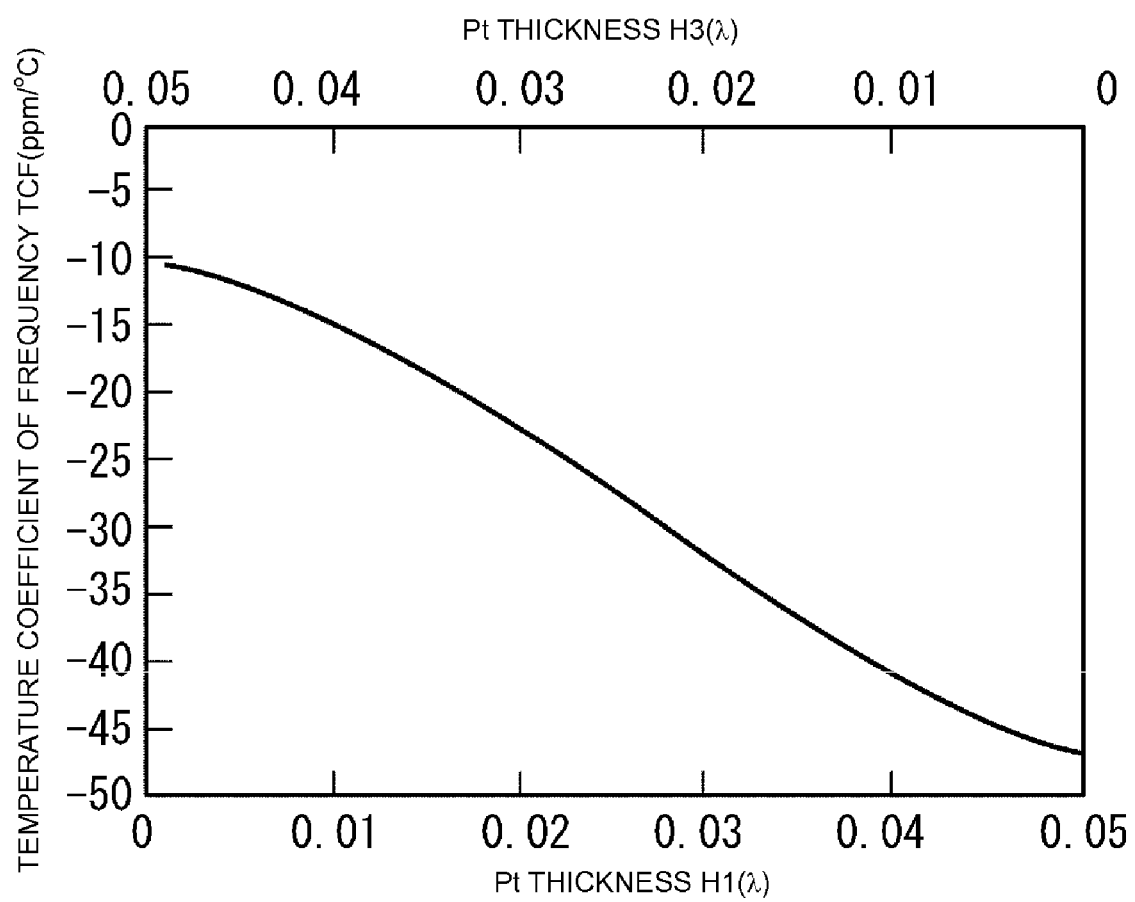
FIG. 8 shows a change in the temperature coefficient of frequency (TCF) (ppm/° C.) as the thicknesses H1 and H3 of the Pt films constituting the first and third conductive layers are changed, provided that in the first preferred embodiment, the thickness H2 of the Al film constituting the second conductive layer is fixed to about 0.07λ and that the sum of the thicknesses H1 and H3 of the Pt films constituting the first and third conductive layers, i.e., H1+H3, is fixed to about 0.05λ.

A change in electromechanical coefficient $K^2$ and a change in temperature coefficient of frequency (TCF) as the ratio of the thickness H1 to the thickness H3 was changed were determined, provided that the sum of the thickness H1 of the first conductive layer 7 and the thickness H3 of the third conductive layer 9, i.e., H1+H3, was fixed to about 0.05λ. FIGS. 7 and 8 show the results.

Here, the thickness H2 of the second conductive layer 8 composed of Al was set to about 0.07λ. The thicknesses of the first and third conductive layers 7 and 9 made of Pt films were changed as shown in FIGS. 7 and 8.

FIGS. 7 and 8 clearly show that in order to obtain an electromechanical coefficient $K^2$ of about 10% to about 15% and a relatively satisfactory temperature coefficient of frequency (TCF), H1>0.01λ and H3>0.022λ are preferably satisfied. The results shown in FIGS. 3 to 8 demonstrate that in the case where the thicknesses H1 to H3 of the first to third conductive layers 7 to 9 are selected in such a manner that 0.04λ<H1+H3<0.12λ, H1>0.01λ, H3>0.022λ, and 0.05λ<H2<0.15λ are preferably satisfied, the electromechanical coefficient $K^2$ is in the range of about 10% to about 15%, and the temperature coefficient of frequency (TCF) is in the range of about −30 ppm/° C. to about −18 ppm/° C. That is, it is possible to achieve a good balance between a reduction in insertion loss and a satisfactory temperature coefficient of frequency.

Figure 9:
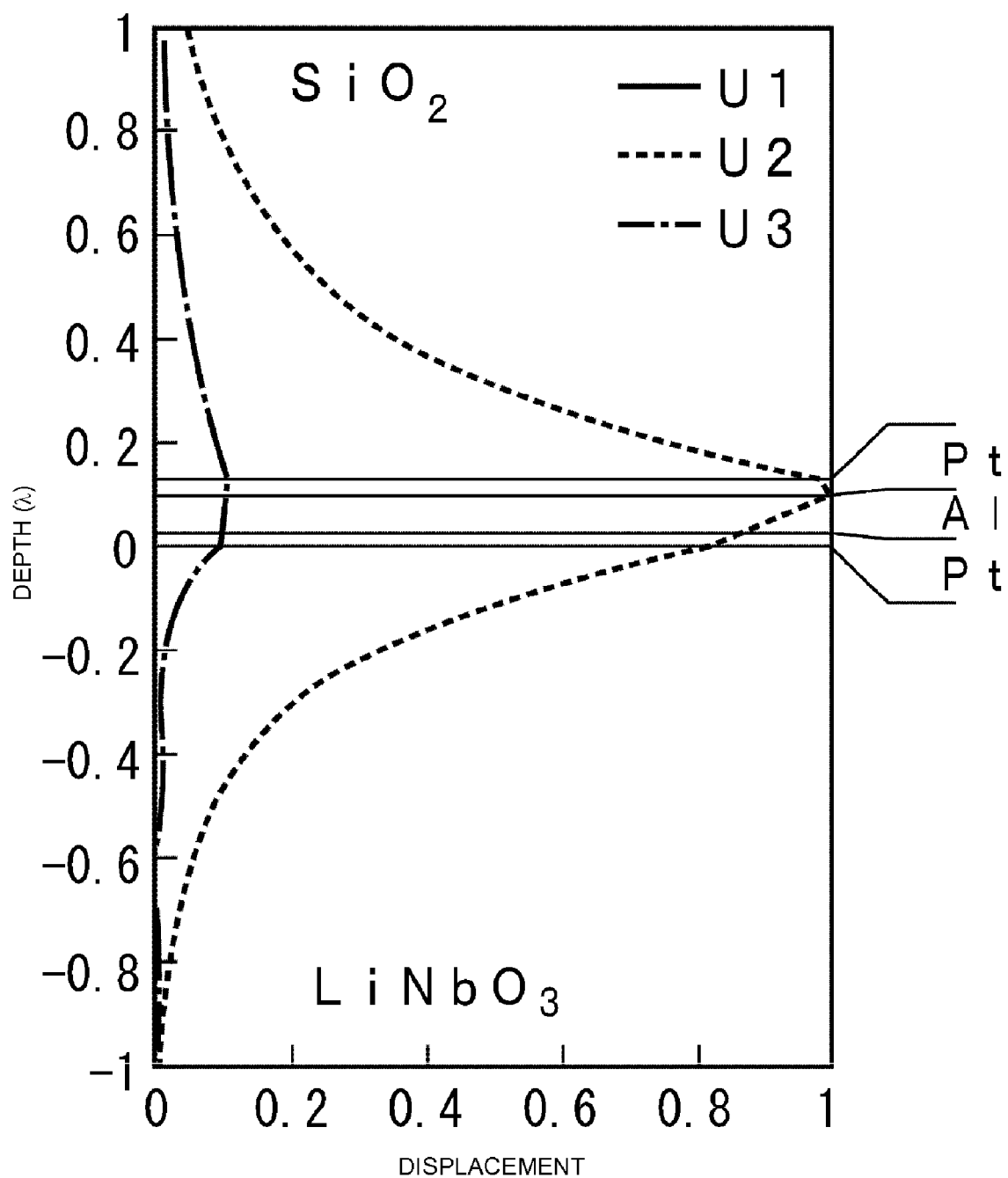
FIG. 9 is a schematic sectional elevational view of a displacement distribution of a boundary acoustic wave in the boundary acoustic wave device according to the first preferred embodiment of the present invention.

FIG. 9 is a schematic sectional elevational view of a displacement distribution of a boundary acoustic wave in the case where the first conductive layer 7 is made of a Pt film and has a thickness H1 of about 0.03λ, the second conductive layer 8 is made of an Al film and has a thickness H2 of about 0.07λ, and the third conductive layer 9 is made of a Pt film and has a thickness H3 of about 0.03λ.

Figure 10:
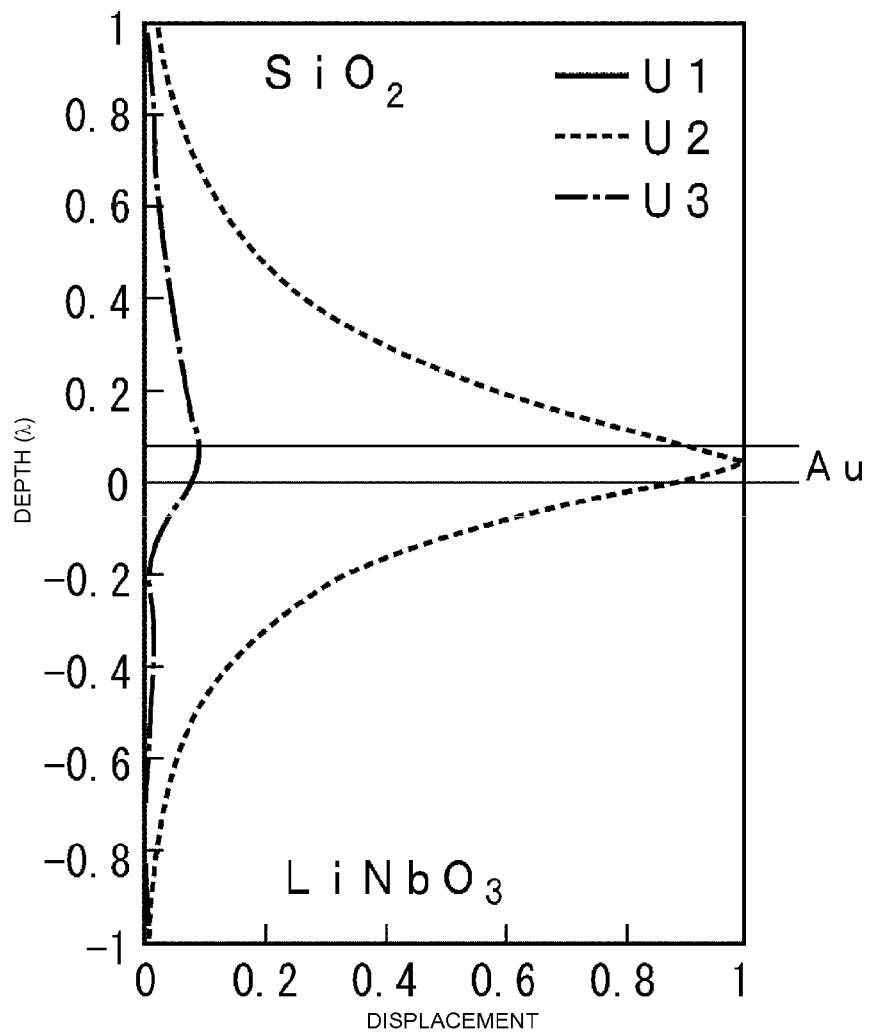
FIG. 10 is a schematic sectional elevational view of a displacement distribution of a boundary acoustic wave in a boundary acoustic wave device according to the related art including IDT electrodes each made of a single Au layer.

For comparison, FIG. 10 is a schematic sectional elevational view of a displacement distribution of a boundary acoustic wave in a boundary acoustic wave device including IDT electrodes each made of a single Au layer having a thickness of 0.06λ.

In FIG. 10, the top of the displacement distribution of boundary acoustic wave is located near the center of each IDT electrode in the thickness direction. In contrast, FIG. 9 clearly shows that in the foregoing preferred embodiment, the displacement distribution having two peaks located on the piezoelectric substance 2 side and the dielectric substance 3 side is formed. That is, in the boundary acoustic wave device 1 according to the foregoing preferred embodiment, the displacement distribution has a good balance between the piezoelectric substance 2 side and the dielectric substance 3 side. Thus, both of the electromechanical coefficient $K^2$ and the temperature coefficient of frequency (TCF) are relatively satisfactory and well-balanced.

Furthermore, despite substantially the same acoustic velocity of boundary wave in FIGS. 9 and 10, the thickness of the entire IDT according to the foregoing preferred embodiment is large compared with the related art as shown in FIG. 10, thereby resulting in a low electrical resistance, which is preferable.

Second Preferred Embodiment

A boundary acoustic wave device according to a second preferred embodiment was prepared as in the above preferred embodiment, except that each of the first and third conductive layers 7 and 9 was made of an Au film. Then evaluation was performed.

Figure 11:
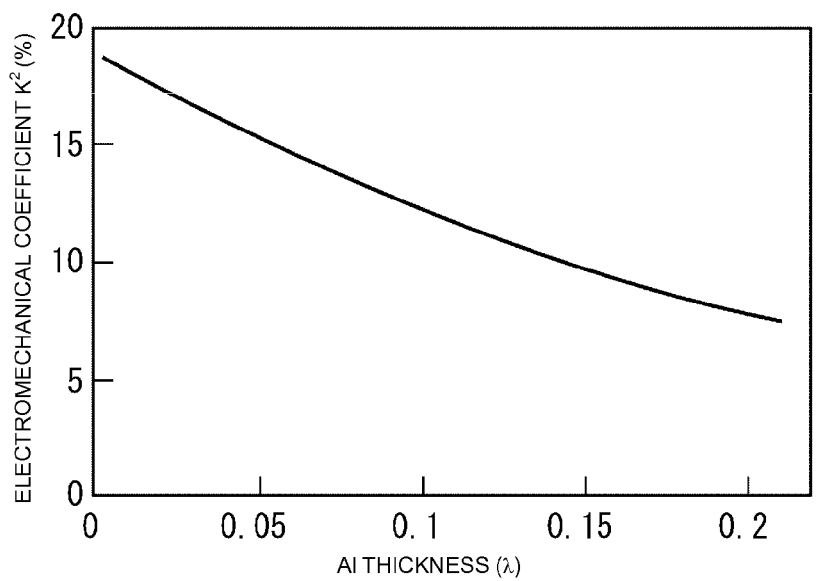
FIG. 11 shows a change in electromechanical coefficient $K^2$ (%) as an Al film constituting a second conductive layer is changed, provided that in a second preferred embodiment, thicknesses H1 and H3 of Au films constituting first and third conductive layers are set to about 0.025λ.
Figure 12:
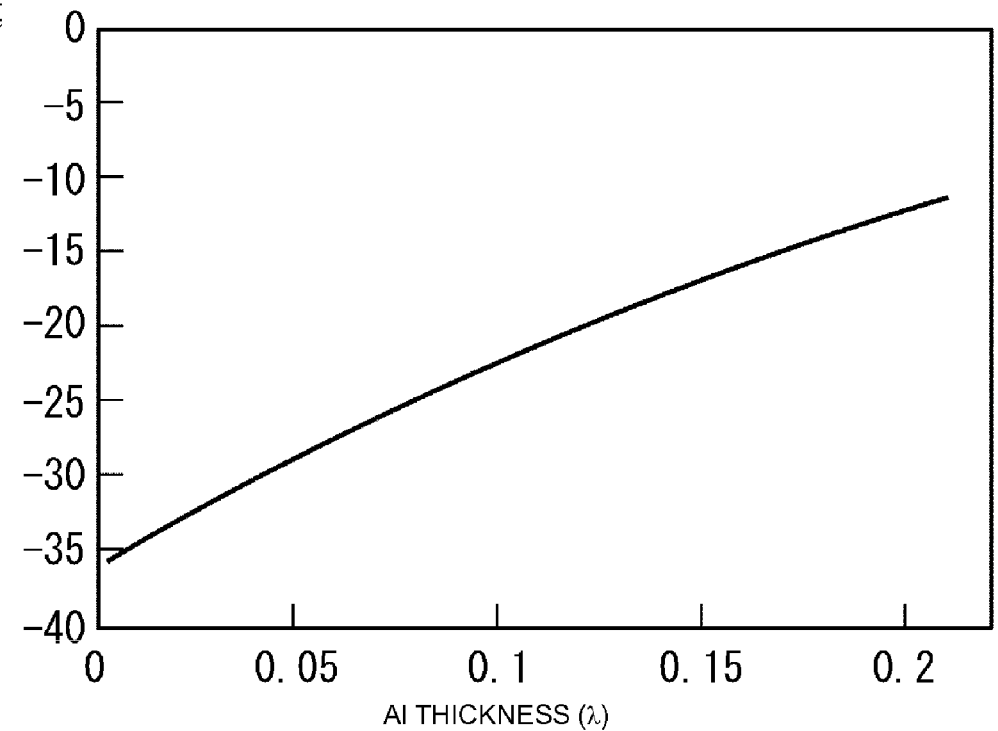
FIG. 12 shows a change in the temperature coefficient of frequency (TCF) (ppm/° C.) as the Al film constituting the second conductive layer is changed, provided that in the second preferred embodiment, the thicknesses H1 and H3 of the Au films constituting the first and third conductive layers are set to about 0.025λ.

Like the simulation using the finite element method according to the first preferred embodiment, a change in electromechanical coefficient $K^2$ and a change in temperature coefficient of frequency (TCF) as the thickness H2 of the second conductive layer made of the Al film was changed were determined, provided that thicknesses H1 and H3 of the Au films constituting the first conductive layer 7 and the third conductive layer 9 were fixed to about 0.025λ. FIGS. 11 and 12 show the results. FIGS. 11 and 12 clearly show that also in the case where the first and third conductive layers 7 and 9 are made of the Au films, an increase in the thickness of the Al film constituting the second conductive layer results in reductions in electromechanical coefficient $K^2$ and the absolute value of the temperature coefficient of frequency (TCF). Furthermore, FIGS. 11 and 12 clearly show that in order to obtain an electromechanical coefficient $K^2$ of about 10% to about 15%, the thickness H2 of the Al film constituting the second conductive layer is preferably set in the range of about 0.05λ to about 0.15λ. In this case, the temperature coefficient of frequency (TCF) is in the range of about −29 ppm/° C. to about −17 ppm/° C., which is relatively satisfactory.

Figure 13:
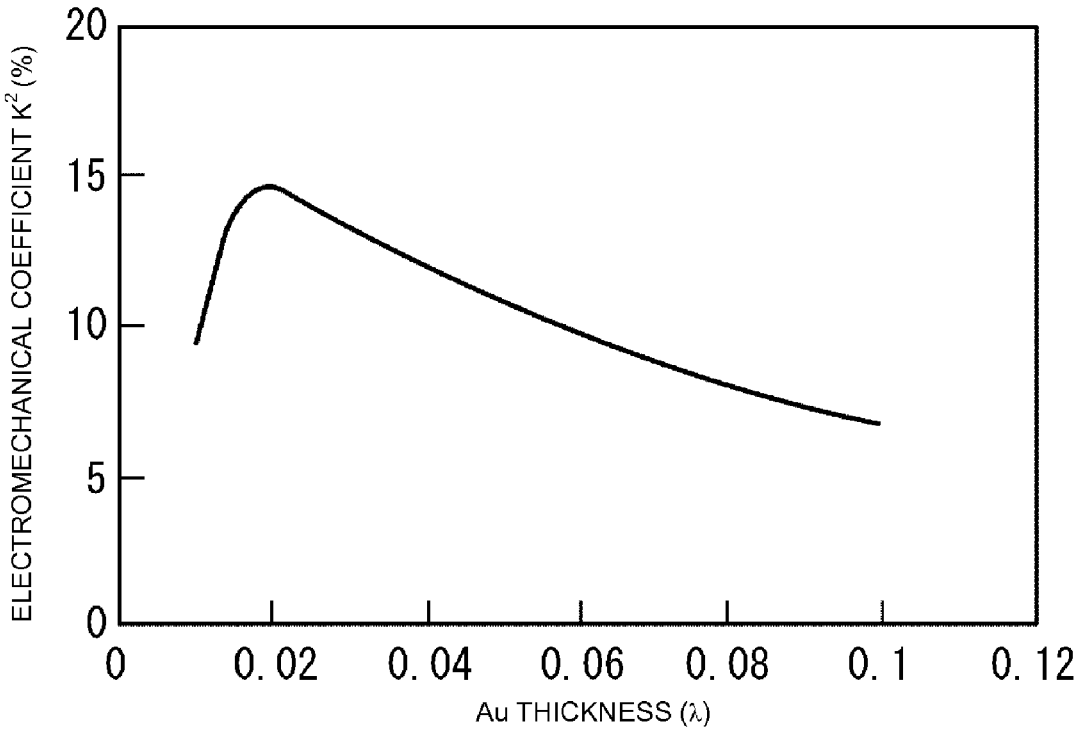
FIG. 13 shows a change in electromechanical coefficient $K^2$ (%) as the thicknesses H1 and H3 (H1=H3) of the Au films constituting the first and third conductive layers are changed, provided that in the second preferred embodiment, the thickness H2 of the Al film constituting the second conductive layer is fixed to about 0.07λ.
Figure 14:
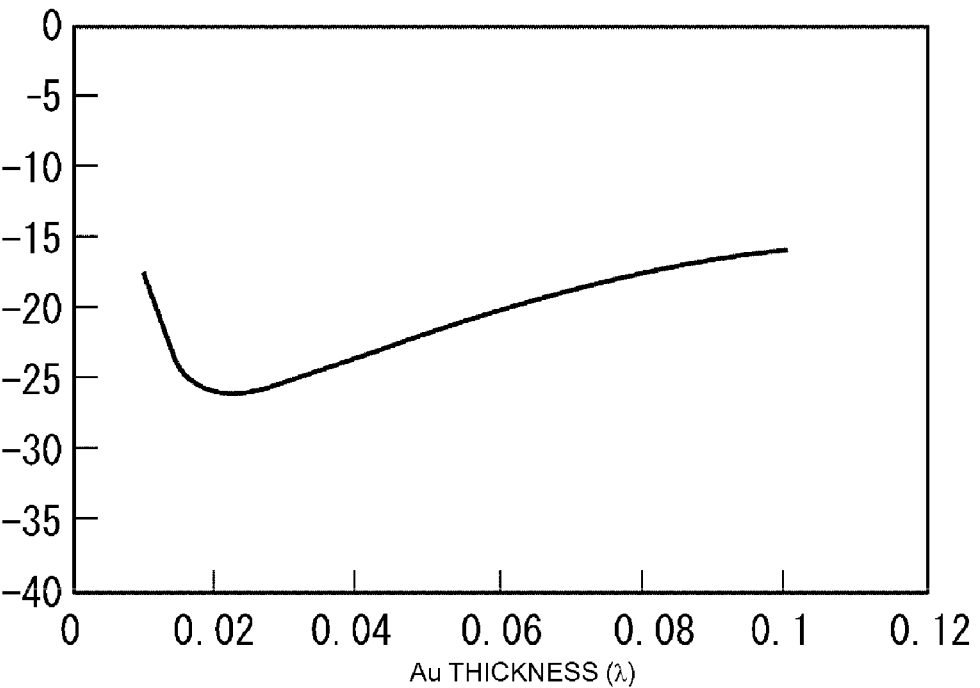
FIG. 14 shows a change in the temperature coefficient of frequency (TCF) (ppm/° C.) as the thicknesses H1 and H3 (H1=H3) of the Au films constituting the first and third conductive layers are changed, provided that in the second preferred embodiment, the thickness H2 of the Al film constituting the second conductive layer is fixed to about 0.07λ.

A change in electromechanical coefficient $K^2$ and a change in temperature coefficient of frequency (TCF) as the thicknesses of H1 and H3 were changed were determined, provided that the thickness H2 of the Al film constituting the second conductive layer 8 is fixed to about 0.07λ, and the thickness H1 of the first conductive layer and the thickness H3 of the third conductive layer satisfy H1=H3, the first and third layers being made of the Au films. FIGS. 13 and 14 show the results.

FIGS. 13 and 14 clearly show that in the case where the thicknesses H1 and H3 of the first and the third conductive layers are in the range of about 0.01λ to about 0.06λ, the electromechanical coefficient $K^2$ is in the range of about 10% to about 15%, and the temperature coefficient of frequency (TCF) is in the range of about −27 ppm/° C. to about −20 ppm/° C., which is relatively satisfactory.

In the case where the thickness H1 of the first conductive layer 7 is less than about 0.02λ, however, boundary acoustic wave are not completely confined, so that the propagation loss is not zero. Thus, the thickness H1 is preferably to be about 0.02λ or more.

The results demonstrate that in the case where H1+H3 satisfies 0.04λ<H1+H3<0.12λ, the electromechanical coefficient $K^2$ and the absolute value of the temperature coefficient of frequency (TCF) are within suitable ranges. That is, the balance between them can be enhanced.

Figure 15:
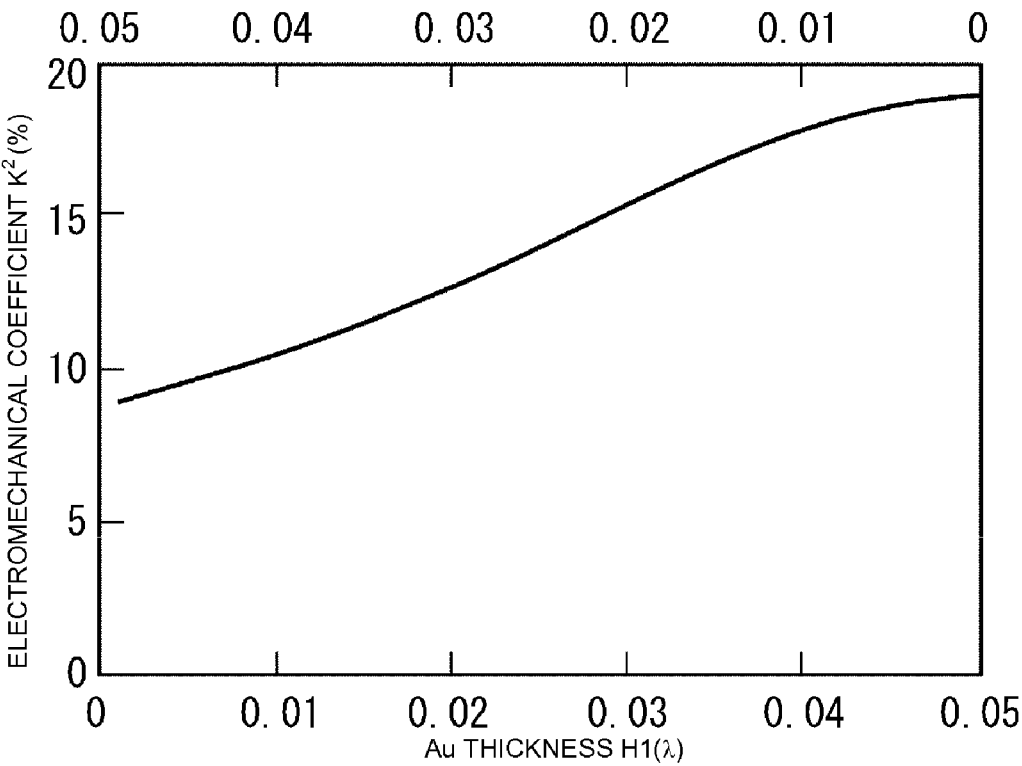
FIG. 15 shows a change in electromechanical coefficient $K^2$ (%) as the thicknesses H1 and H3 of the Au films constituting the first and third conductive layers are changed, provided that in the second preferred embodiment, the thickness H2 of the Al film constituting the second conductive layer is fixed to about 0.07λ and that the sum of the thicknesses H1 and H3 of the Au films constituting the first and third conductive layers, i.e., H1+H3, is fixed to about 0.05λ.
Figure 16:
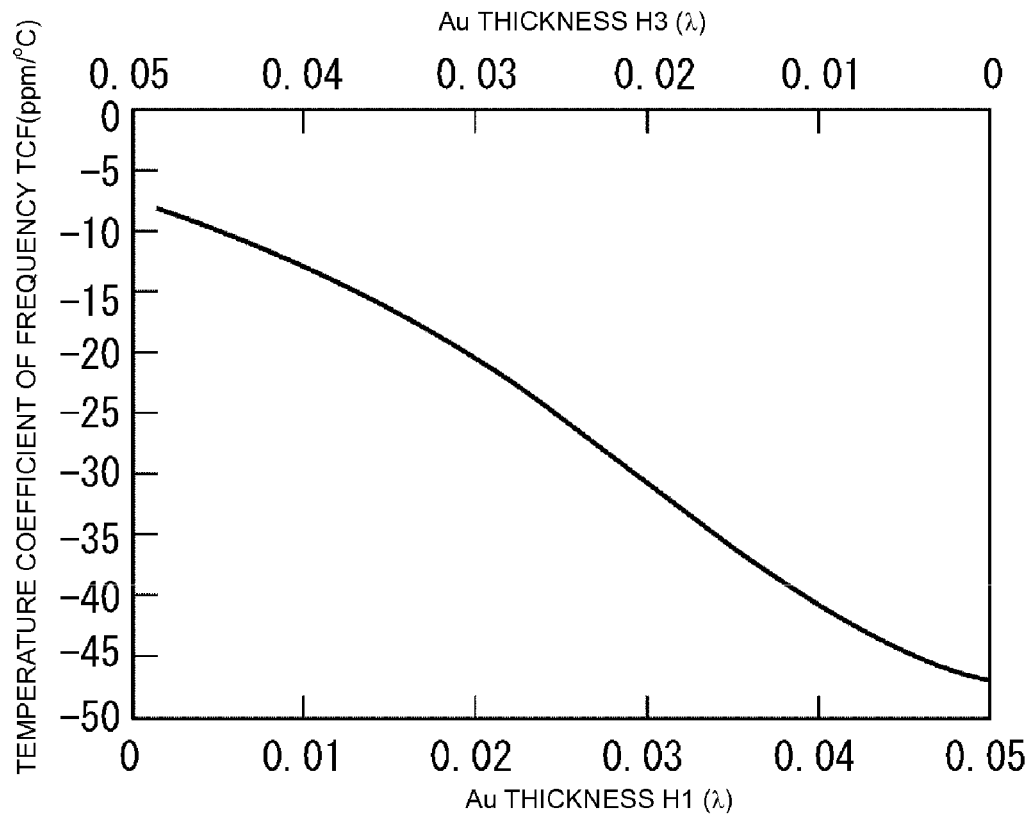
FIG. 16 shows a change in the temperature coefficient of frequency (TCF) (ppm/° C.) as the thicknesses H1 and H3 of the Au films constituting the first and third conductive layers are changed, provided that in the second preferred embodiment, the thickness H2 of the Al film constituting the second conductive layer is fixed to about 0.07λ and that the sum of the thicknesses H1 and H3 of the Au films constituting the first and third conductive layers, i.e., H1+H3, is fixed to about 0.05λ.

Furthermore, in the second preferred embodiment, a change in electromechanical coefficient $K^2$ and a change in temperature coefficient of frequency (TCF) as the ratio of the thickness H1 to the thickness H3 was changed were determined, provided that the sum of the thickness H1 of the first conductive layer 7 and the thickness H3 of the third conductive layer 9, i.e., H1+H3, was fixed to about 0.05λ. Here, the thickness H2 of the second conductive layer 8 composed of Al was set to about 0.07λ. FIGS. 15 and 16 show the results.

FIGS. 15 and 16 clearly show that in order to obtain an electromechanical coefficient $K^2$ of about 10% to about 15% and a relatively satisfactory temperature coefficient of frequency (TCF), H1>0.009λ and H3>0.022λ are preferably satisfied.

In the second preferred embodiment, thus, the results demonstrate that in the case where the thicknesses H1 to H3 of the first to third conductive layers 7 to 9 are selected in such a manner that 0.04λ<H1+H3<0.12λ, H1>0.009λ, H3>0.022λ, and 0.05λ<H2<0.15λ are satisfied, the electromechanical coefficient $K^2$ is in the range of about 10% to about 15%, and the temperature coefficient of frequency (TCF) is in the range of about −30 ppm/° C. to about −18 ppm/° C., which are satisfactory ranges.

Third Preferred Embodiment

A boundary acoustic wave device according to a third preferred embodiment was prepared as in the above preferred embodiment, except that each of the first and third conductive layers 7 and 9 was made of a Pt film and that the second conductive layer 8 was made of a Cu film. Then evaluation was performed.

Figure 17:
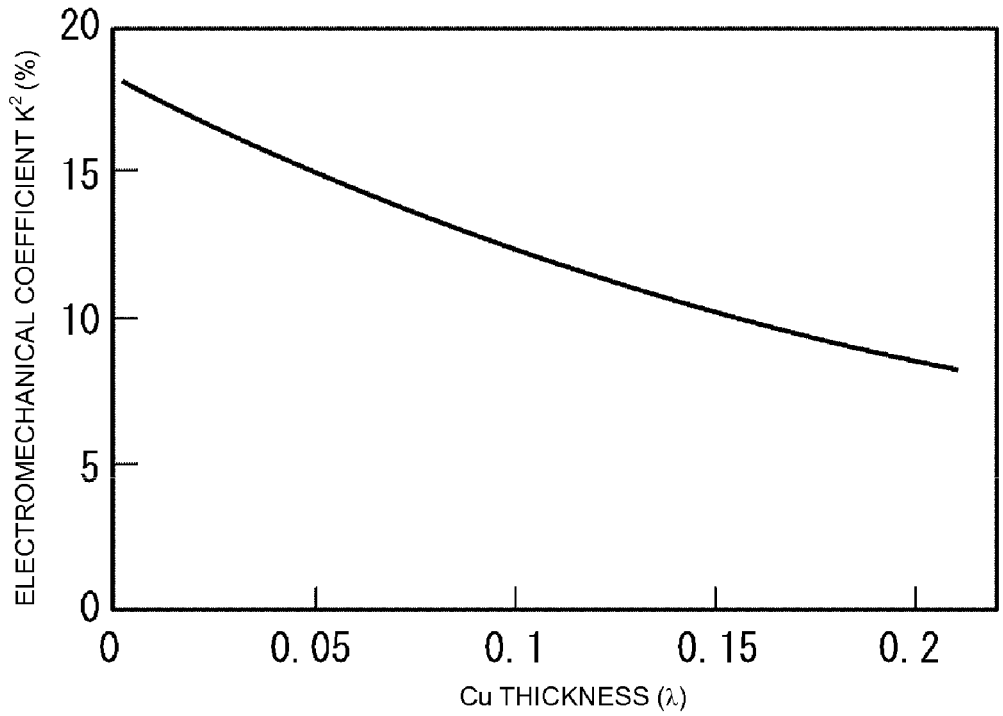
FIG. 17 shows a change in electromechanical coefficient $K^2$ (%) as the thickness H2 of a Cu film constituting a second conductive layer is changed, provided that in a third preferred embodiment, thicknesses H1 and H3 of Pt films constituting first and third conductive layers are set to about 0.03λ.
Figure 18:
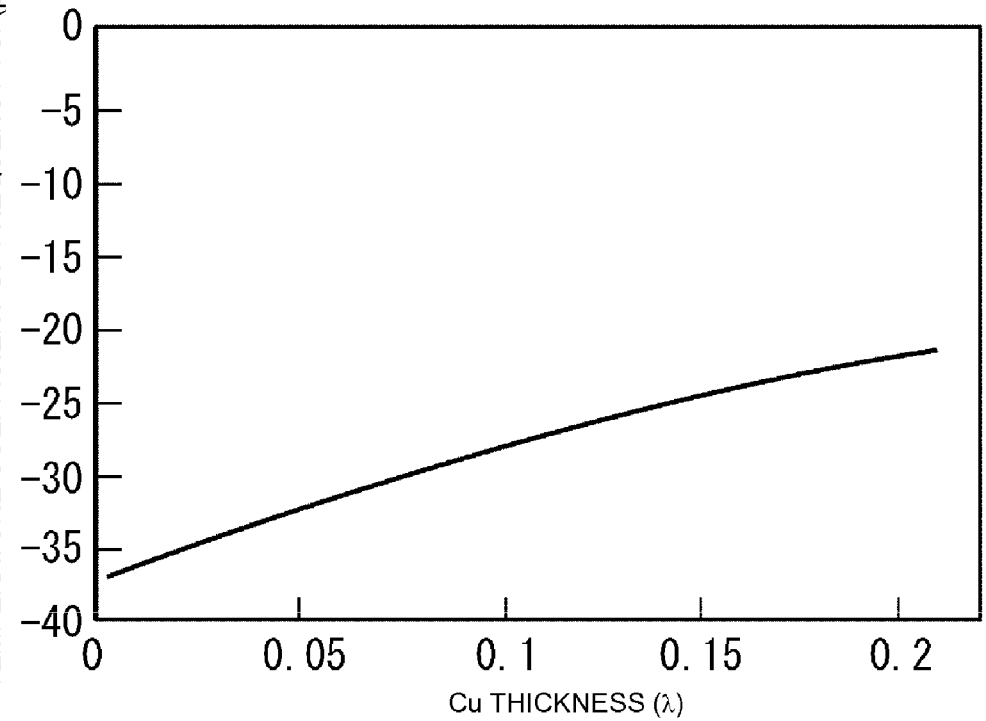
FIG. 18 shows the temperature coefficient of frequency (TCF) (ppm/° C.) as the thickness H2 of the Cu film constituting the second conductive layer is changed, provided that in the third preferred embodiment, the thicknesses H1 and H3 of the Pt films constituting the first and third conductive layers are set to about 0.03λ.

Like the simulation using the finite element method according to the first preferred embodiment, a change in electromechanical coefficient $K^2$ and a change in temperature coefficient of frequency (TCF) as the thickness H2 of the second conductive layer made of the Cu film was changed were determined, provided that thicknesses H1 and H3 of the Pt films constituting the first conductive layer 7 and the third conductive layer 9 were fixed to about 0.03λ. FIGS. 17 and 18 show the results. FIGS. 17 and 18 clearly show that also in the case where the first and third conductive layers 7 and 9 are made of the Pt films and where the second conductive layer is made of the Cu film, an increase in the thickness of the Cu film constituting the second conductive layer results in reductions in electromechanical coefficient $K^2$ and the absolute value of the temperature coefficient of frequency (TCF). Furthermore, FIGS. 17 and 18 clearly show that in order to obtain an electromechanical coefficient $K^2$ of about 10% to about 15%, the thickness H2 of the Cu film constituting the second conductive layer is preferably set in the range of about 0.07λ to about 0.16λ. In this case, the absolute value of the temperature coefficient of frequency (TCF) is about 30 ppm/° C. or less, which is relatively satisfactory.

Figure 19:
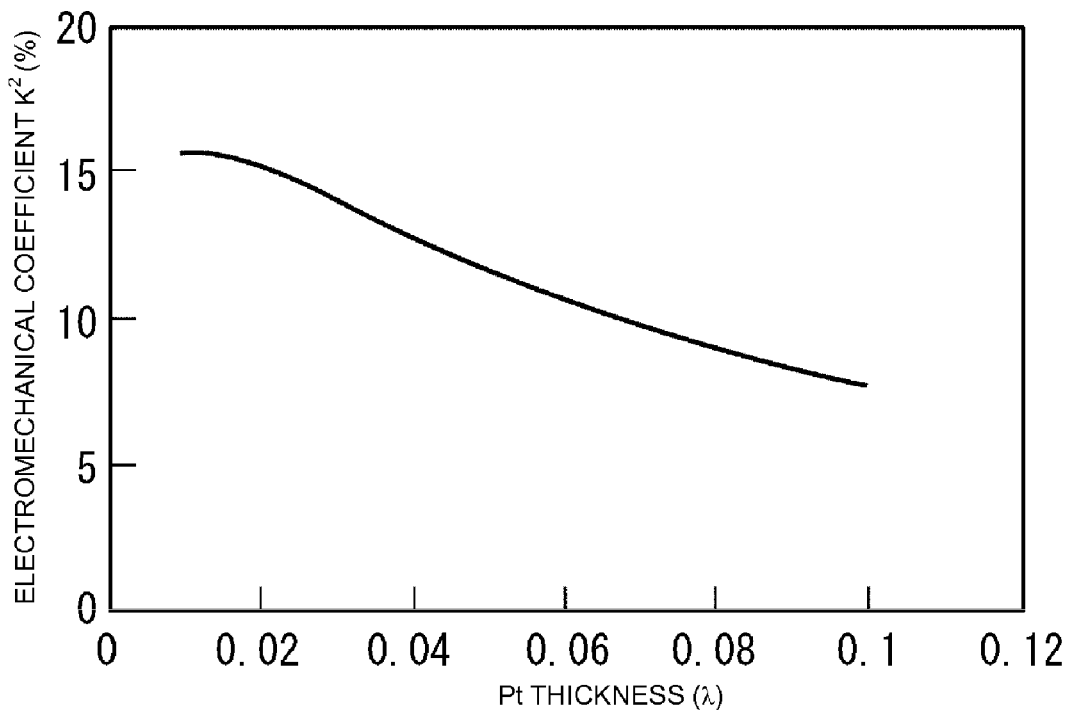
FIG. 19 shows a change in electromechanical coefficient $K^2$ (%) as the thicknesses H1 and H3 (H1=H3) of the Pt films constituting the first and third conductive layers are changed, provided that in the third preferred embodiment, the thickness H2 of the Cu film constituting the second conductive layer is fixed to about 0.07λ.
Figure 20:
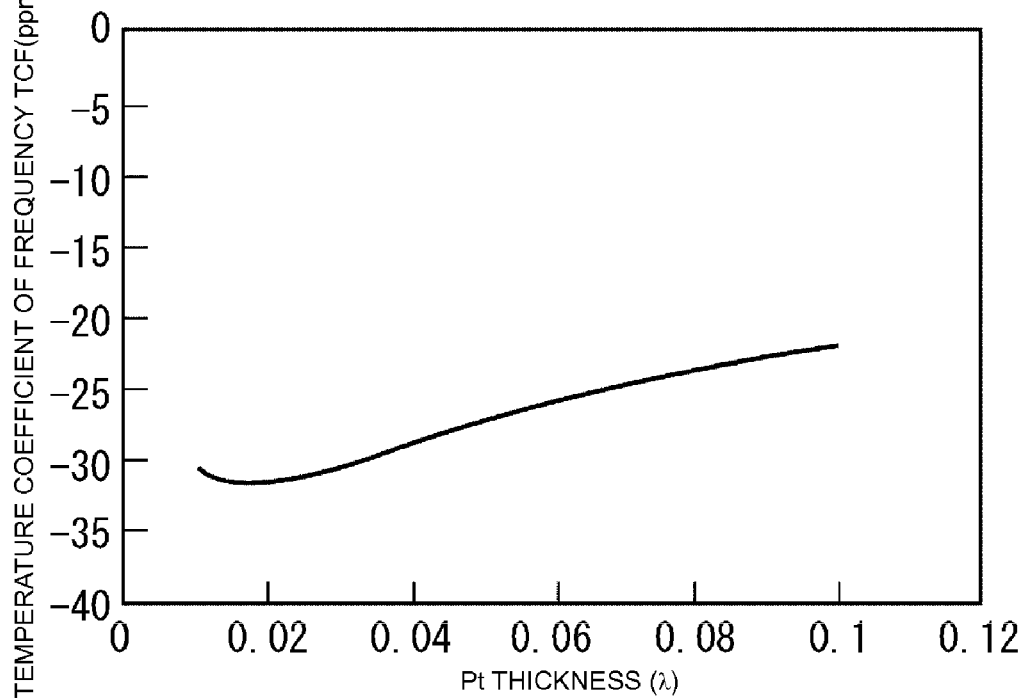
FIG. 20 shows a change in the temperature coefficient of frequency (TCF) (ppm/° C.) as the thicknesses H1 and H3 (H1=H3) of the Pt films constituting the first and third conductive layers are changed, provided that in the third preferred embodiment, the thickness H2 of the Cu film constituting the second conductive layer is fixed to about 0.07λ.

A change in electromechanical coefficient $K^2$ and a change in temperature coefficient of frequency (TCF) as the thicknesses of H1 and H3 were changed were determined, provided that the thickness H2 of the Cu film constituting the second conductive layer 8 is fixed to about 0.07λ, and the thickness H1 of the first conductive layer and the thickness H3 of the third conductive layer satisfy H1=H3, the first and third layers being made of the Pt films. FIGS. 19 and 20 show the results.

FIGS. 19 and 20 clearly show that in the case where the thicknesses H1 and H3 of the first and the third conductive layers are in the range of about 0.03λ to about 0.07λ, the electromechanical coefficient $K^2$ is in the range of about 10% to about 15%, and the temperature coefficient of frequency (TCF) is in the range of about −30 ppm/° C. to about −25 ppm/° C., which is relatively satisfactory.

In the case where the thickness H1 of the first conductive layer 7 is less than about 0.03λ, however, boundary acoustic waves are not completely confined, so that the propagation loss is not zero. Thus, the thickness H1 is preferably about 0.03λ or more.

The results demonstrate that in the case where H1+H3 satisfies 0.06λ<H1+H3<0.14λ, the electromechanical coefficient $K^2$ and the absolute value of the temperature coefficient of frequency (TCF) are within suitable ranges. That is, the balance between them can be enhanced.

Figure 21:
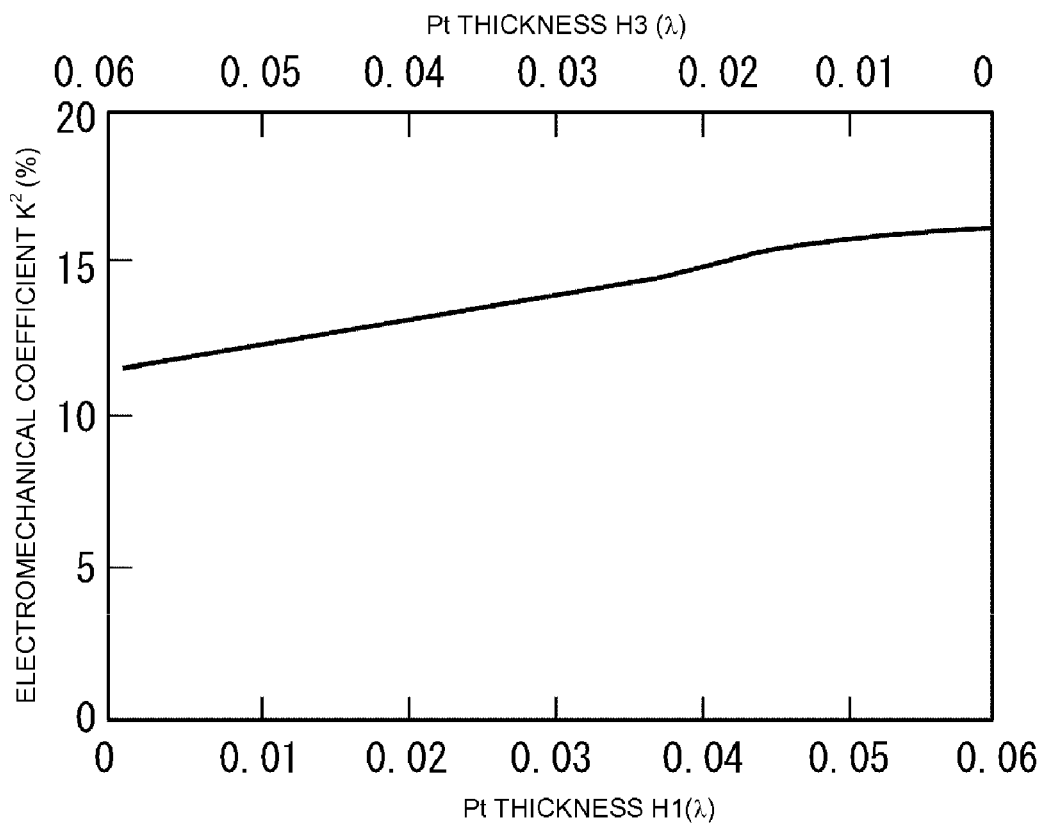
FIG. 21 shows a change in electromechanical coefficient $K^2$ (%) as the thicknesses H1 and H3 of the Pt films constituting the first and the third conductive layers are changed, provided that in the third preferred embodiment, the thickness H2 of the Cu film constituting the second conductive layer is fixed to about 0.07λ and that the sum of the thicknesses H1 and H3 of the Pt films constituting the first and third conductive layers, i.e., H1+H3, is fixed to about 0.06λ.
Figure 22:
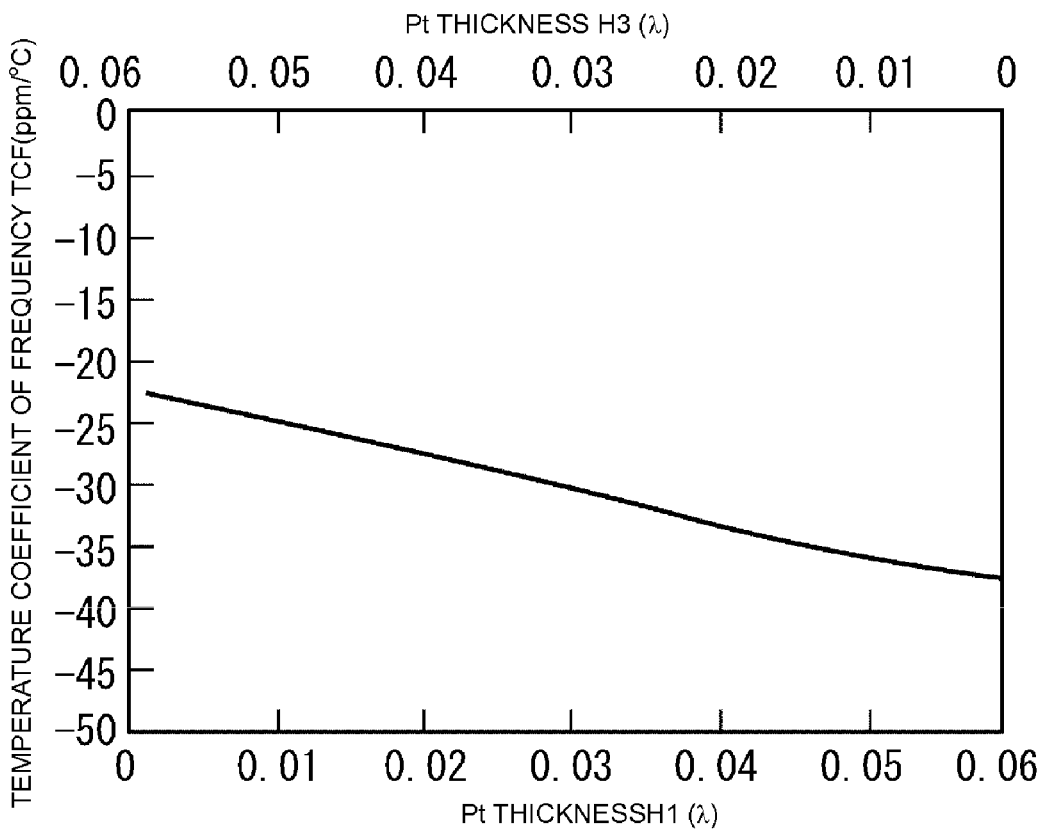
FIG. 22 shows a change in the temperature coefficient of frequency (TCF) (ppm/° C.) as the thicknesses H1 and H3 of the Pt films constituting the first and the third conductive layers are changed, provided that in the third preferred embodiment, the thickness H2 of the Cu film constituting the second conductive layer is fixed to about 0.07λ and that the sum of the thicknesses H1 and H3 of the Pt films constituting the first and third conductive layers, i.e., H1+H3, is fixed to about 0.06λ.

Furthermore, in the third preferred embodiment, a change in electromechanical coefficient $K^2$ and a change in temperature coefficient of frequency (TCF) as the ratio of the thickness H1 to the thickness H3 was changed were determined, provided that the sum of the thickness H1 of the first conductive layer 7 and the thickness H3 of the third conductive layer 9, i.e., H1+H3, was fixed to about 0.06λ. Here, the thickness H2 of the second conductive layer 8 composed of Al was set to about 0.07λ. FIGS. 21 and 22 show the results.

FIGS. 21 and 22 clearly show that in order to obtain an electromechanical coefficient $K^2$ of about 10% to about 15% and a relatively satisfactory temperature coefficient of frequency (TCF), H1>0.01λ and H3>0.03λ are preferably satisfied.

In the third preferred embodiment, thus, the results demonstrate that in the case where the thicknesses H1 to H3 of the first to third conductive layers 7 to 9 are selected in such a manner that 0.06λ<H1+H3<0.14λ, H1>0.01λ, H3>0.03λ, and 0.07λ<H2<0.16λ are satisfied, the electromechanical coefficient $K^2$ is in the range of about 10% to about 15%, and the temperature coefficient of frequency (TCF) is in the range of about −30 ppm/° C. to about −18 ppm/° C., which are satisfactory ranges.

Fourth Preferred Embodiment

A boundary acoustic wave device according to a fourth preferred embodiment was prepared as in the above preferred embodiment, except that each of the first and third conductive layers 7 and 9 was made of an Au film and that the second conductive layer 8 was made of a Cu film. Then evaluation was performed.

Figure 23:
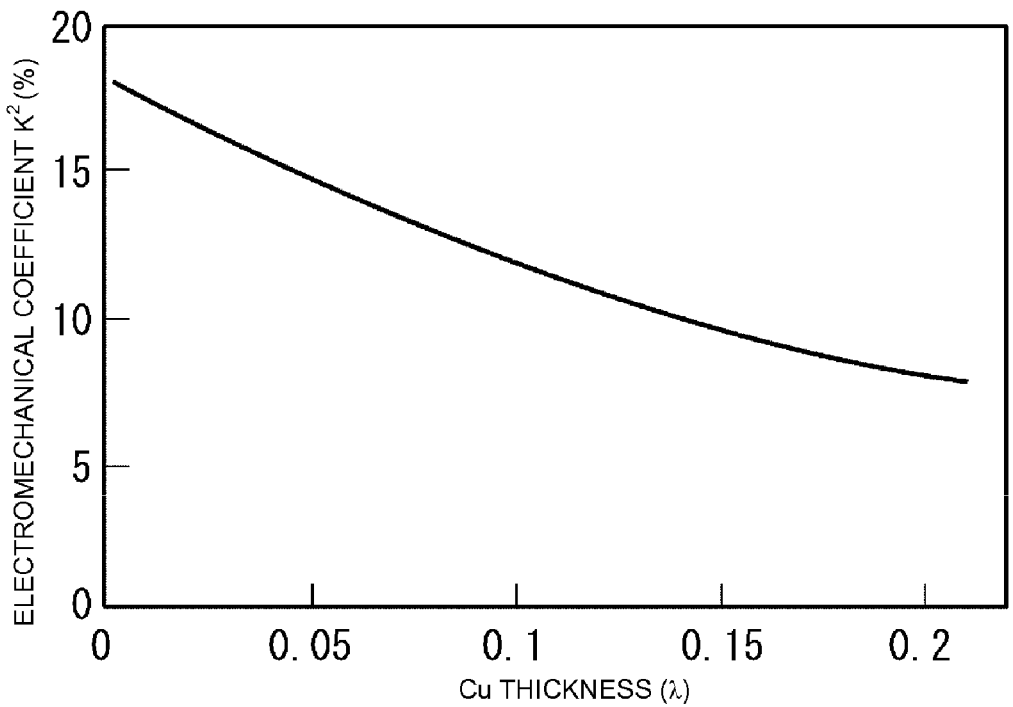
FIG. 23 shows a change in electromechanical coefficient $K^2$ (%) as the thickness H2 of a Cu film constituting a second conductive layer is changed, provided that in a fourth preferred embodiment, thicknesses H1 and H3 of Au films constituting first and third conductive layers is set to about 0.03λ.
Figure 24:
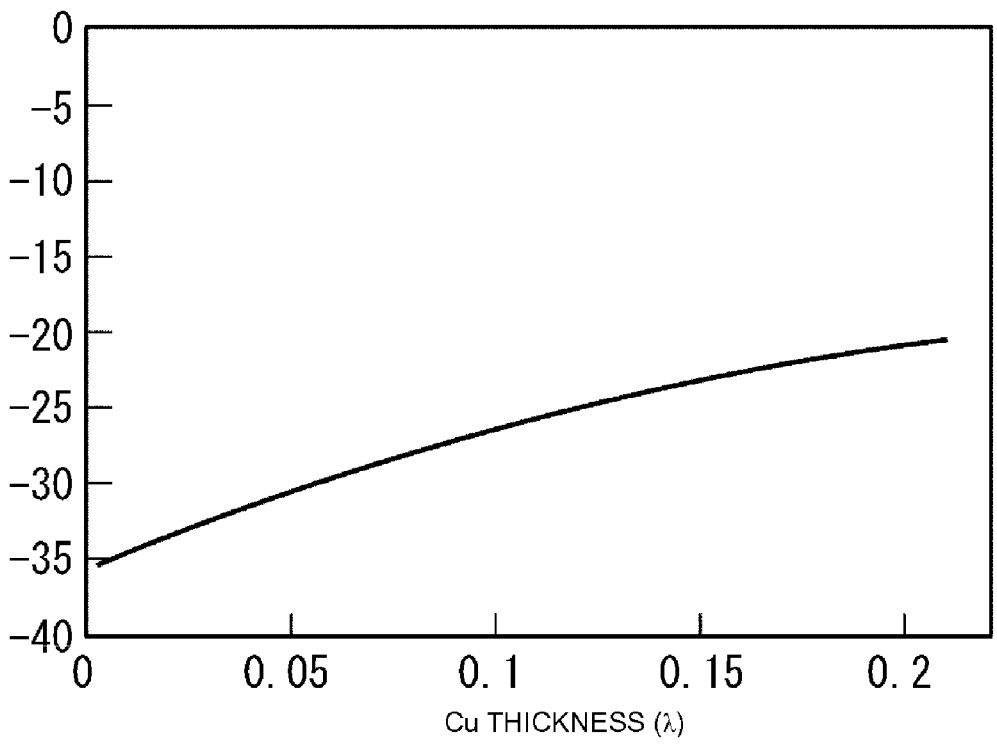
FIG. 24 shows a change in the temperature coefficient of frequency (TCF) (ppm/° C.) as the thickness H2 of the Cu film constituting the first and third conductive layers is changed, as provided that in the fourth preferred embodiment, the thicknesses H1 and H3 of the Au films constituting the first and third conductive layers is set to about 0.03λ.

Like the simulation using the finite element method according to the first preferred embodiment, a change in electromechanical coefficient $K^2$ and a change in temperature coefficient of frequency (TCF) as the thickness H2 of the second conductive layer made of the Cu film was changed were determined, provided that thicknesses H1 and H3 of the Au films constituting the first conductive layer 7 and the third conductive layer 9 were fixed to about 0.03λ. FIGS. 23 and 24 show the results. FIGS. 23 and 24 clearly show that also in the case where the first and third conductive layers 7 and 9 are made of the Au films and where the second conductive layer is made of the Cu film, an increase in the thickness of the Cu film constituting the second conductive layer results in reductions in electromechanical coefficient $K^2$ and the absolute value of the temperature coefficient of frequency (TCF). Furthermore, FIGS. 23 and 24 clearly show that in order to obtain an electromechanical coefficient $K^2$ of about 10% to about 15%, the thickness H2 of the Cu film constituting the second conductive layer is preferably set in the range of about 0.05λ to about 0.14λ. In this case, the temperature coefficient of frequency (TCF) is in the range of about −30 ppm/° C. to about −23 ppm/° C., which is relatively satisfactory.

Figure 25:
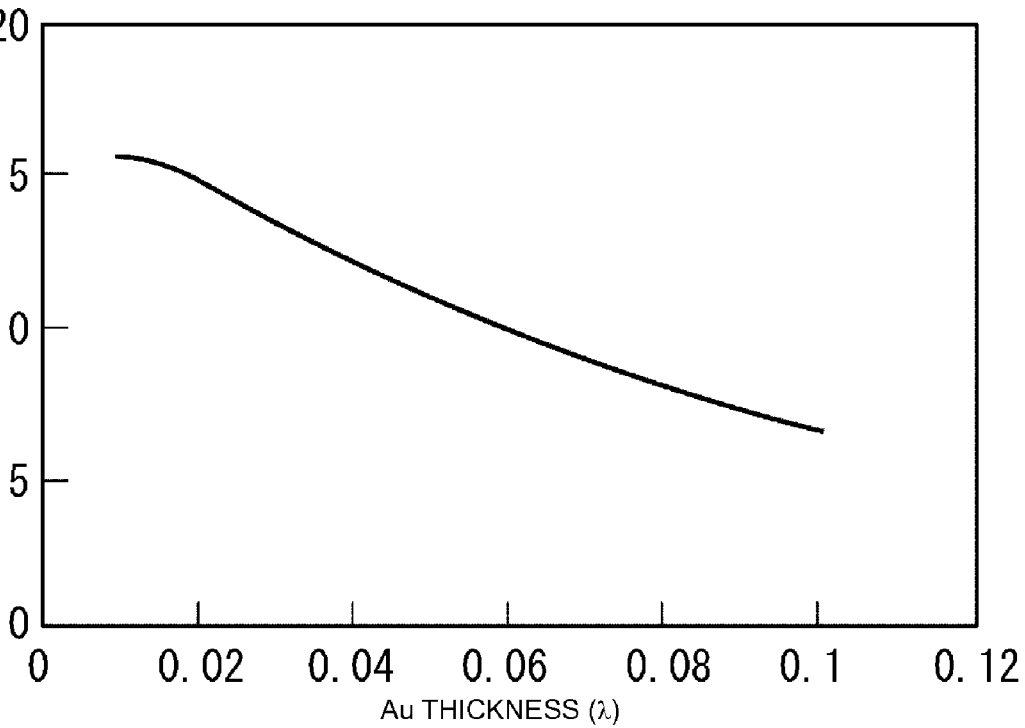
FIG. 25 shows a change in electromechanical coefficient $K^2$ (%) as the thicknesses H1 and H3 (H1=H3) of the Au films constituting the first and third conductive layers are changed, provided that in the fourth preferred embodiment, the thickness H2 of the Cu film constituting the second conductive layer is fixed to about 0.07λ.
Figure 26:
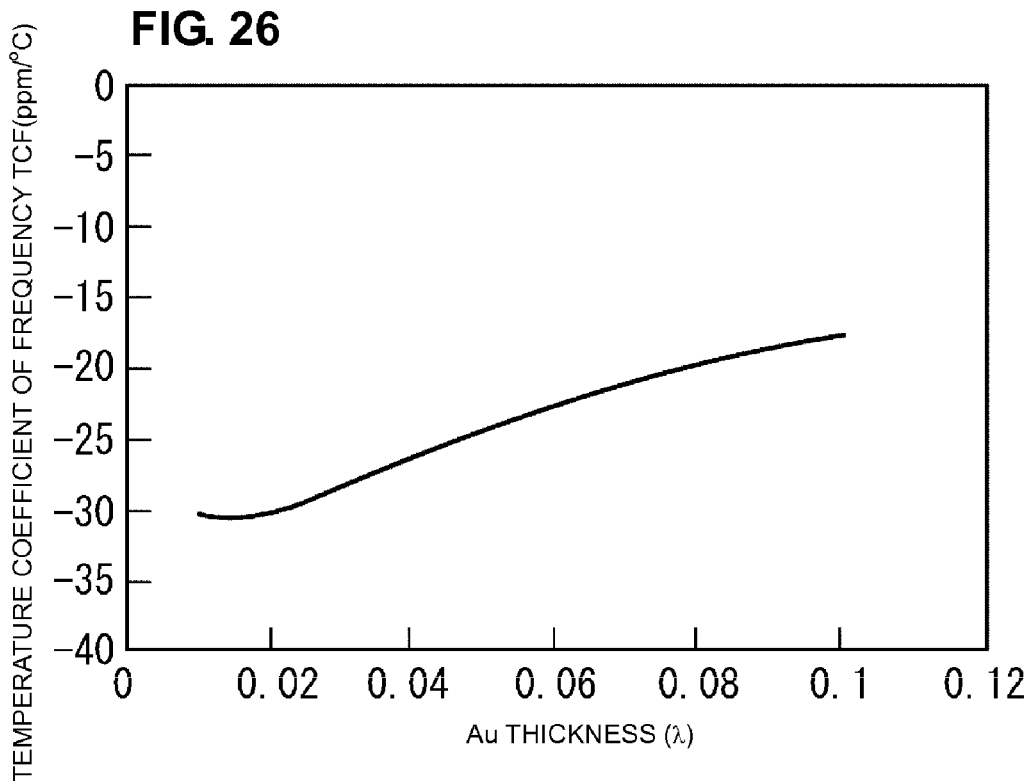
FIG. 26 shows a change in the temperature coefficient of frequency (TCF) (ppm/° C.) as the thicknesses H1 and H3 (H1=H3) of the Au films constituting the first and third conductive layers are changed, provided that in the fourth preferred embodiment, the thickness H2 of the Cu film constituting the second conductive layer is fixed to about 0.07λ.

A change in electromechanical coefficient $K^2$ and a change in temperature coefficient of frequency (TCF) as the thicknesses of H1 and H3 were changed were determined, provided that the thickness H2 of the Cu film constituting the second conductive layer 8 is fixed to about 0.07λ, and the thickness H1 of the first conductive layer and the thickness H3 of the third conductive layer satisfy H1=H3, the first and third layers being made of the Au films. FIGS. 25 and 26 show the results.

FIGS. 25 and 26 clearly show that in the case where the thicknesses H1 and H3 of the first and the third conductive layers are in the range of about 0.02λ to about 0.06λ, the electromechanical coefficient $K^2$ is in the range of about 10% to about 15%, and the temperature coefficient of frequency (TCF) is in the range of about −30 ppm/° C. to about −23 ppm/° C., which is relatively satisfactory.

In the case where the thickness H1 of the first conductive layer 7 is less than about 0.02, however, boundary acoustic wave are not completely confined, so that the propagation loss is not zero. Thus, the thickness H1 is preferably about 0.02λ or more.

The results demonstrate that in the case where H1+H3 satisfies $0.04\lambda < H1+H3 < 0.12\lambda$, the electromechanical coefficient $K^2$ and the absolute value of the temperature coefficient of frequency (TCF) are within suitable ranges. That is, the balance between them can be enhanced.

Figure 27:
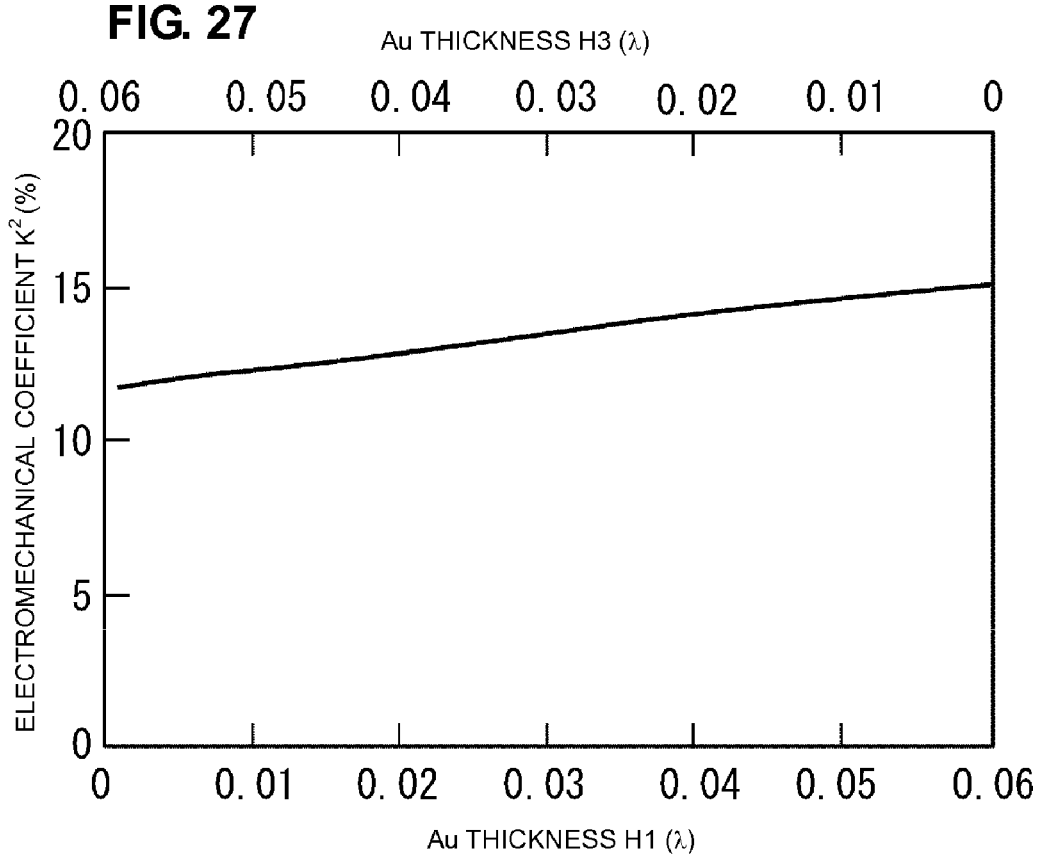
FIG. 27 shows a change in electromechanical coefficient $K^2$ (%) as the thicknesses H1 and H3 of the Au films constituting the first and third conductive layers are changed, provided that in the fourth preferred embodiment, the thickness H2 of the Cu film constituting the second conductive layer is fixed to 0.07λ and that the sum of the thicknesses H1 and H3 of the Au films constituting the first and third conductive layers, i.e., H1+H3, is fixed to about 0.06λ.
Figure 28:
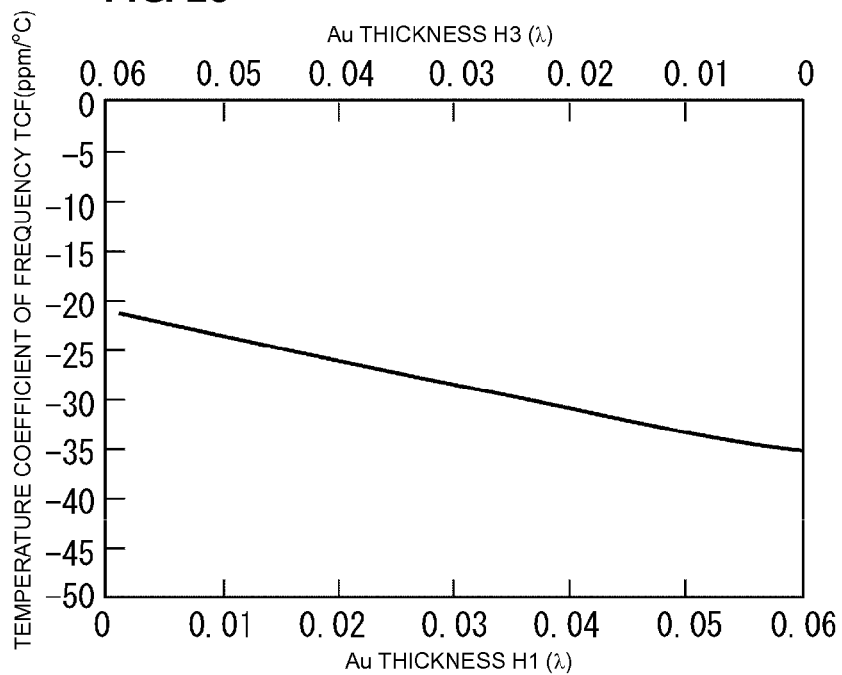
FIG. 28 shows a change in the temperature coefficient of frequency (TCF) (ppm/° C.) as the thicknesses H1 and H3 of the Au films constituting the first and third conductive layers are changed, provided that in the fourth preferred embodiment, the thickness H2 of the Cu film constituting the second conductive layer is fixed to about 0.07λ and that the sum of the thicknesses H1 and H3 of the Au films constituting the first and third conductive layers, i.e., H1+H3, is fixed to about 0.06λ.

Furthermore, in the fourth preferred embodiment, a change in electromechanical coefficient $K^2$ and a change in temperature coefficient of frequency (TCF) as the ratio of the thickness H1 to the thickness H3 was changed were determined, provided that the sum of the thickness H1 of the first conductive layer 7 and the thickness H3 of the third conductive layer 9, i.e., H1+H3, was fixed to about 0.06λ. Here, the thickness H2 of the second conductive layer 8 composed of Al was set to about 0.07λ. FIGS. 27 and 28 show the results.

FIGS. 27 and 28 clearly show that in order to obtain an electromechanical coefficient $K^2$ of about 10% to about 15% and a relatively satisfactory temperature coefficient of frequency (TCF), $H1 > 0.01\lambda$ and $H3 > 0.026\lambda$ are preferably satisfied.

In the fourth preferred embodiment, thus, the results demonstrate that in the case where the thicknesses H1 to H3 of the first to third conductive layers 7 to 9 are selected in such a manner that $0.04\lambda < H1+H3 < 0.12\lambda$, $H1 > 0.01\lambda$, $H3 > 0.026\lambda$, and $0.05\lambda < H2 < 0.14\lambda$ are satisfied, the electromechanical coefficient $K^2$ is in the range of about 10% to about 15%, and the temperature coefficient of frequency (TCF) is in the range of about −30 ppm/° C. to about −18 ppm/° C., which are satisfactory ranges.

Fifth Preferred Embodiment

In the foregoing first to fourth preferred embodiments, each of the IDT electrodes preferably has a structure in which the first to third conductive layers 7 to 9 are stacked. In a preferred embodiment of the present invention, each IDT electrode may include additional layers, such as an adhesive layer and a diffusion barrier layer, in addition to the first to third conductive layers.

Figure 29:
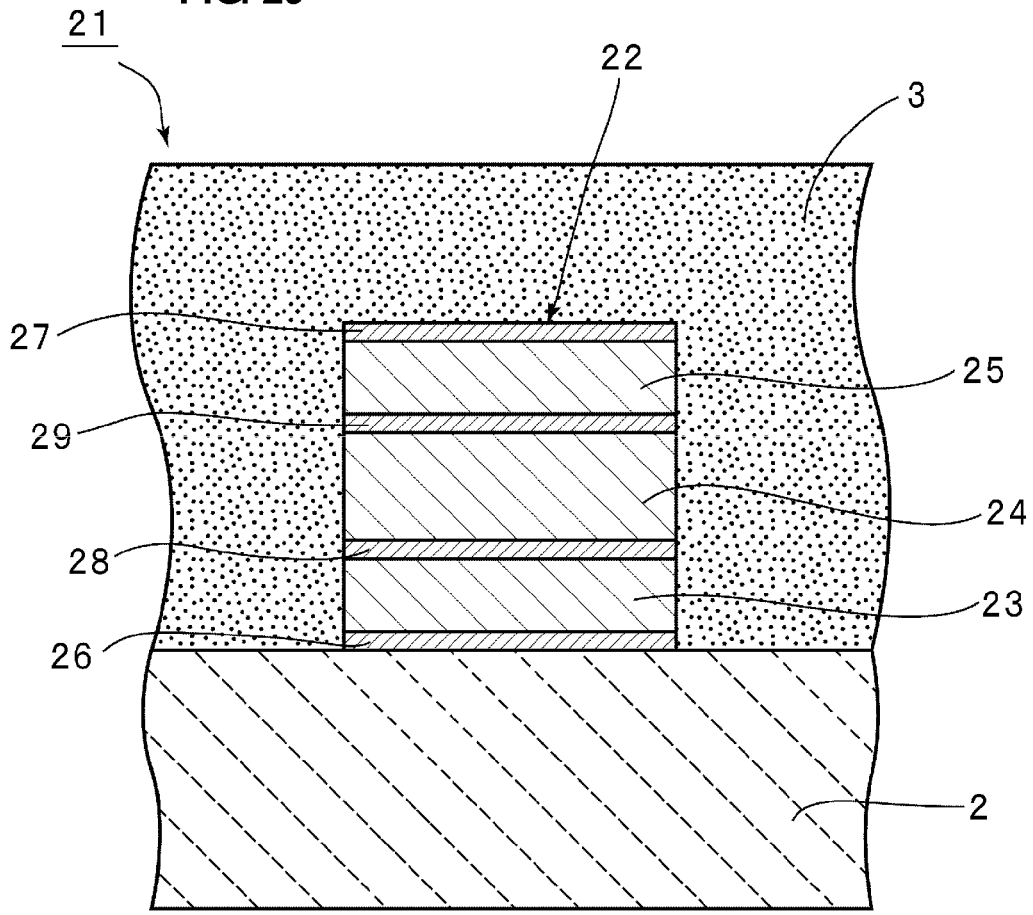
FIG. 29 is a schematic enlarged partially sectioned elevational view illustrating the stacked structure of one IDT electrode of a boundary acoustic wave device according to a modification of the first preferred embodiment of the present invention.

FIG. 29 is a schematic partially sectioned elevational view of one IDT electrode including adhesive layers and diffusion barrier layers of the boundary acoustic wave device according to a modified preferred embodiment.

In a boundary acoustic wave device 21 according to the modified preferred embodiment, each IDT electrode 22 includes first to third conductive layers 23 to 25. In this preferred embodiment, each of the first and third conductive layers is made of a Pt film, and the second conductive layer is made of an Al film. An adhesive layer 26 is stacked on a surface of the first conductive layer 23 adjacent to the piezoelectric substance 2. Similarly, an adhesive layer 27 is arranged on a surface of the third conductive layer 25 adjacent to the dielectric substance 3. The adhesive layers 26 and 27 are composed of Ti and function to increase the adhesion of the first and third conductive layers 23 and 25 to the piezoelectric substance 2 or the dielectric substance 3.

A material increasing adhesion is not limited to Ti. The adhesion layer may be composed of an appropriate metal that has high adhesion to the piezoelectric substance 2 or the dielectric substance 3 or an alloy primarily containing the metal, as compared with that of the material constituting the first and third conductive layers.

Diffusion barrier layers 28 and 29 are arranged between the first and second conductive layers 23 and 24 and between the second and third conductive layers 24 and 25, respectively. The diffusion barrier layers 28 and 29 are arranged to prevent the diffusion of metals, such as Pt and Al, constituting the conductive layers, between the first and second conductive layers 23 and 24 and between the second and third conductive layers 24 and 25. A material constituting diffusion barrier layers 28 and 29 is not particularly limited as long as it provides the effect of preventing the diffusion described above. For example, the diffusion barrier layers 28 and 29 may be composed of an appropriate metal such as Ti. In case the diffusion barrier layers 28 and 29 are not provided, interdiffusion due to the contact of the Pt film and the Al film may result in an increase in the resistance between the electrode fingers, which may deteriorate the characteristics. In contrast, in this modified preferred embodiment, it is possible to prevent the interdiffusion of Pt and Al to further improve the characteristics.

In this modified preferred embodiment, the diffusion barrier layers are arranged between the first and second conductive layers and between the second and third conductive layers. The diffusion barrier layer may be arranged either between the first and second conductive layers or between the second and third conductive layers.

Furthermore, the diffusion barrier layers may be arranged on outer surfaces of the first and third conductive layers.

The adhesion layers may also be arranged between the first and second conductive layers and between the second and third conductive layers as well as the outer surfaces of the first and third conductive layers.

In the first preferred embodiment, the piezoelectric substance 2 is preferably composed of $LiNbO_3$ but may be composed of an appropriate piezoelectric substance having a negative temperature coefficient of frequency (TCF), e.g., $LiTaO_3$. Examples of the piezoelectric substance include PZT, LBO, langasite, and langanite in addition to $LiNbO_3$ and $LiTaO_3$.

The dielectric substance 3 may also be an appropriate dielectric substance having a positive temperature coefficient of frequency (TCF). Examples thereof include silicon oxide in a broad sense, including $SiO_2$.

The metals constituting the first to third conductive layers are not limited to Pt/Al/Pt, Au/Al/Au, Pt/Cu/Pt, and Au/Cu/Au, which are stacked structures described above. Various combinations of metals may be used. Alternatively, the first to third conductive layers may be composed of alloys primarily containing these metals.

Furthermore, a metal constituting the first conductive layer may be different from a metal constituting the third conductive layer. Preferably, the same metal is used to constitute the first and third conductive layers. In this case, the first and third conductive layers are composed of the same metal, thus reducing the cost and simplifying the process for forming the conductive layers.

Among various combinations of metals, Pt and Au are preferable as materials constituting the first and third conductive layers because they have high densities and low acoustic velocities. Pt has the advantage that it has a high electrical resistance but excellent stability. Au has the advantage that it has lower stability but a lower electrical resistance than those of Pt.

Thus, the first and third conductive layers composed of Pt have preferably higher reliability, and the first and third conductive layers composed of Au have preferably lower electrical resistance.

The metal constituting the second conductive layer or an alloy primarily containing the metal is not particularly limited as long as it has a density lower than that of the metal constituting the first and third conductive layers. Preferably, Al and Cu are used. Each of Al and Cu has a relatively low density and a low electrical resistance. Thus, Al and Cu are preferred as metals constituting the second conductive layer.

Al has a relatively low electrical resistance and excellent stability. Cu has stability lower than that of Al but a lower electrical resistance. Thus, the use of Al as a material constituting the second conductive layer results in improvement in reliability. Alternatively, the use of Cu as a material constituting the second conductive layer results in a reduction in electrical resistance.

Use of a Pt/Al/Pt stacked structure, therefore, results in further improvement in reliability, which is desirable. Alternatively, in the case of using a Au/Al/Au stacked structure, although reliability is only slightly reduced, a reduction in resistance can be effectively achieved. Similarly, in the case of using a Pt/Cu/Pt stacked structure, although reliability is only slightly reduced, a reduction in resistance can be effectively achieved. Use of an Au/Cu/Au stacked structure results in a further reduction in electrical resistance.

The use of different first and third conductive layers results in effective IDT electrodes when different characteristics are required for the first and third conductive layers.

In the first preferred embodiment, the planar electrode pattern shown in FIG. 2 is preferably formed. The electrode pattern of the boundary acoustic wave device of the present invention is not limited to the resonator. The boundary acoustic wave device of the present invention may be modified so as to have electrode patterns configured to constitute various resonators and filters.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a piezoelectric substance;
   a dielectric substance stacked on the piezoelectric substance; and
   IDT electrodes arranged between the piezoelectric substance and the dielectric substance; wherein
   the piezoelectric substance has a negative temperature coefficient of frequency;
   the dielectric substance has a positive temperature coefficient of frequency;
   each of the IDT electrodes includes:
      a first conductive layer arranged on a side of the piezoelectric substance and composed of a metal with a relatively high density or an alloy primarily containing the metal;
      a second conductive layer arranged on a side of the first conductive layer adjacent to the dielectric substance and composed of a metal with a relatively low density or an alloy primarily containing the metal; and
      a third conductive layer arranged on a side of the second conductive layer adjacent to the dielectric substance and composed of a metal with a relatively high density or an alloy primarily containing the metal; wherein
   if thicknesses of the first, second, and third conductive layers are H1, H2, and H3, and a period of the IDT electrodes is λ, the following relationships are satisfied:

$0.04\lambda < H1+H3 < 0.12\lambda$ $H1 > 0.009\lambda, H3 > 0.022\lambda$ $0.05\lambda < H2 < 0.16\lambda.$ 2. The boundary acoustic wave device according to claim 1, wherein the metal with a relatively high density or the alloy primarily containing the metal is one metal selected from Pt, Au, W, Ta, Cu, Ag, Ni, Fe, Cr, and Pd or an alloy primarily containing one metal among these metals, and the metal with a relatively low density or the alloy primarily containing the metal is one metal selected from Al, Mg, Ti, Cr, Ni, Cu, and Ag or an alloy primarily containing one metal among these metals, and wherein the metal with a relatively low density or the alloy primarily containing the metal is different from the metal with a relatively high density or the alloy primarily containing the metal.

3. The boundary acoustic wave device according to claim 1, wherein the first and third conductive layers are composed of Pt or an alloy primarily containing Pt, the second conductive layer is composed of Al or an alloy primarily containing Al, and the thicknesses H1 to H3 of the first to third conductive layers satisfy the following relationships:

$0.04\lambda < H1+H3 < 0.12\lambda$ $H1 > 0.01\lambda, H3 > 0.022\lambda$ $0.05\lambda < H2 < 0.15\lambda$.

4. The boundary acoustic wave device according to claim 1, wherein the first and third conductive layers are composed of Au or an alloy primarily containing Au, the second conductive layer is composed of Al or an alloy primarily containing Al, and the thicknesses H1 to H3 of the first to third conductive layers satisfy the following relationships:

$0.04\lambda < H1+H3 < 0.12\lambda$ $H1 > 0.009\lambda, H3 > 0.022\lambda$ $0.05\lambda < H2 < 0.15\lambda$.

5. The boundary acoustic wave device according to claim 1, wherein the first and third conductive layers are composed of Pt or an alloy primarily containing Pt, the second conductive layer is composed of Cu or an alloy primarily containing Cu, and the thicknesses H1 to H3 of the first to third conductive layers satisfy the following relationships:

$0.06\lambda < H1+H3 < 0.14\lambda$ $H1 > 0.01\lambda, H3 > 0.03\lambda$ $0.07\lambda < H2 < 0.16\lambda$.

6. The boundary acoustic wave device according to claim 1, wherein the first and third conductive layers are composed of Au or an alloy primarily containing Au, the second conductive layer is composed of Cu or an alloy primarily containing Cu, and the thicknesses H1 to H3 of the first to third conductive layers satisfy the following relationships:

$0.04\lambda < H1+H3 < 0.12\lambda$ $H1 > 0.01\lambda$ $H3 > 0.026\lambda$ $0.05\lambda < H2 < 0.14\lambda$.

7. The boundary acoustic wave device according to claim 1, wherein each of the IDT electrodes further includes an adhesive layer that has a higher adhesion to a target material than the adhesion of each of the first to third conductive layers to the target material, and wherein the adhesive layer is arranged at at least one selected from positions between the piezoelectric substance and the first conductive layer, between the dielectric substance and the third conductive layer, between the first and second conductive layers, and between the second and third conductive layers.

8. The boundary acoustic wave device according to claim 1, wherein each of the IDT electrodes further includes a diffusion barrier layer that prevents the diffusion of the metals or the alloys constituting the electrodes, and wherein the diffusion barrier layer is arranged at at least one of positions between the piezoelectric substance and the first conductive layer, between the third conductive layer and the dielectric substance, between the first and second conductive layers, and between the second and third conductive layers.

9. The boundary acoustic wave device according to claim 1, wherein the piezoelectric substance is LiNbO₃ and has Euler angles ($\phi$, $\theta$, $\psi$) of ($-5°<\phi<5°$, $100°<\theta<110°$, $-30°<\psi<30°$), and the dielectric substance is composed of silicon oxide.

* * * * *